(12) United States Patent
Galor Gluskin

(10) Patent No.: US 11,314,150 B2
(45) Date of Patent: Apr. 26, 2022

(54) PHASE DETECTION AUTOFOCUS (PDAF) OPTICAL SYSTEM

(71) Applicant: QUALCOMM Incorporated, San Diego, CA (US)

(72) Inventor: Micha Galor Gluskin, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 123 days.

(21) Appl. No.: 16/737,809

(22) Filed: Jan. 8, 2020

(65) Prior Publication Data
US 2021/0208482 A1 Jul. 8, 2021

(51) Int. Cl.
| | |
|---|---|
| *G03B 13/36* | (2021.01) |
| *H04N 5/232* | (2006.01) |
| *G02B 5/20* | (2006.01) |
| *H04N 5/33* | (2006.01) |
| *G02B 3/04* | (2006.01) |
| *G02B 15/14* | (2006.01) |
| *H01L 27/146* | (2006.01) |

(52) U.S. Cl.
CPC .............. *G03B 13/36* (2013.01); *G02B 3/04* (2013.01); *G02B 5/208* (2013.01); *G02B 15/142* (2019.08); *H04N 5/232122* (2018.08); *H04N 5/33* (2013.01); *H01L 27/14627* (2013.01)

(58) Field of Classification Search
CPC .... G03B 13/36; H04N 5/232122; H04N 5/33; H04N 9/04557; H04N 5/36961; G02B 3/04; G02B 5/208; G02B 15/142; G02B 3/0056; G02B 7/28; H01L 27/14627; H01L 27/14625; G01B 11/24
See application file for complete search history.

(56) References Cited

U.S. PATENT DOCUMENTS

| | | | | |
|---|---|---|---|---|
| 5,160,834 A | * | 11/1992 | Moriyama | G02B 7/346 250/201.8 |
| 5,402,198 A | * | 3/1995 | Moriyama | G02B 7/346 396/119 |
| 6,473,126 B1 | * | 10/2002 | Higashihara | H04N 5/232122 348/345 |
| 6,597,868 B2 | * | 7/2003 | Suda | H04N 5/36961 396/111 |

(Continued)

OTHER PUBLICATIONS

Kobayashi M., et al., "High-Definition and High-Sensitivity CMOS Image Sensor with all-Pixel Image Plane Phase-Difference Detection Autofocus", Japanese Journal of Applied Physics, vol. 57, No. 10, 1002B5, 2018, 12 pages.

*Primary Examiner* — Shahbaz Nazrul
(74) *Attorney, Agent, or Firm* — Procopio, Cory, Hargreaves & Savitch LLP

(57) ABSTRACT

Apparatus for an optical system optimized for PDAF depth sensing are disclosed herein. An example apparatus includes a phase detection auto focus (PDAF) sensor including a plurality of focus pixels and a plurality of micro lenses. The example apparatus also includes an optical system located above the PDAF sensor and configured to direct light to the micro lenses of the PDAF sensor. In some examples, the optical system includes a lens and an opaque element configured to block light through the lens except for at least one circular asymmetric subsection of the lens.

22 Claims, 15 Drawing Sheets

(56) References Cited

U.S. PATENT DOCUMENTS

| | | | | |
|---|---|---|---|---|
| 7,358,999 B2* | 4/2008 | Ikeda | ............... | H04N 9/04561 |
| | | | | 348/349 |
| 7,652,713 B2* | 1/2010 | Yamasaki | ......... | H01L 27/14609 |
| | | | | 348/345 |
| 8,767,118 B2* | 7/2014 | Yamasaki | ............. | G02B 7/346 |
| | | | | 348/350 |
| 8,773,645 B2* | 7/2014 | Ogino | ................ | G03B 13/36 |
| | | | | 356/4.03 |
| 10,002,899 B2 | 6/2018 | Chou et al. | | |
| 10,015,389 B2 | 7/2018 | Lu et al. | | |
| 10,154,234 B2 | 12/2018 | Liu et al. | | |
| 2008/0259354 A1* | 10/2008 | Gharib | ............... | H04N 13/204 |
| | | | | 356/601 |
| 2012/0038810 A1* | 2/2012 | Taniguchi | ......... | H01L 27/14621 |
| | | | | 348/308 |
| 2017/0187948 A1* | 6/2017 | Wang | .................. | G02B 7/32 |
| 2018/0349378 A1 | 12/2018 | Galor et al. | | |
| 2021/0126032 A1* | 4/2021 | Roh | ................. | H01L 27/14621 |
| 2021/0176447 A1* | 6/2021 | Mann | ................. | H04N 13/257 |

\* cited by examiner

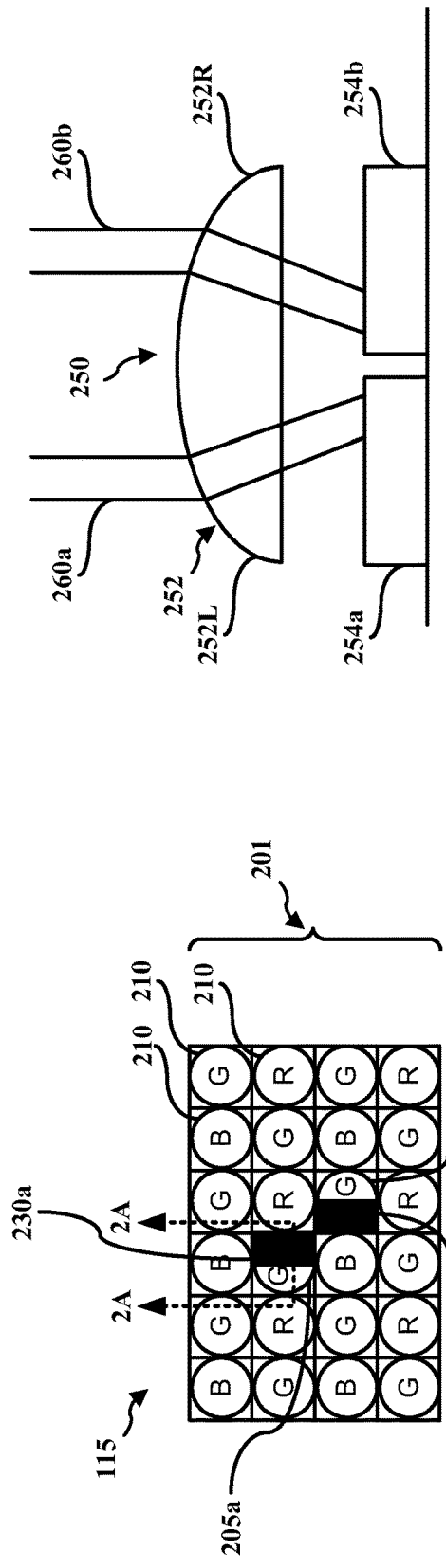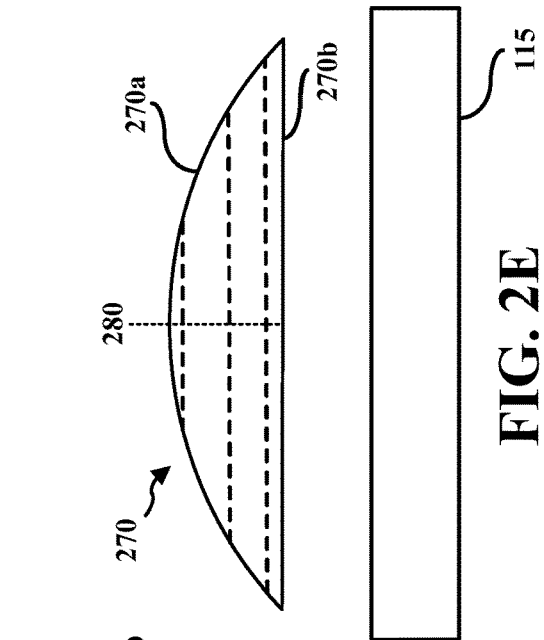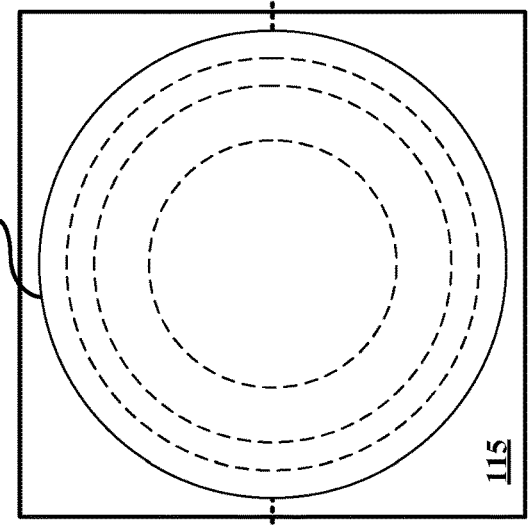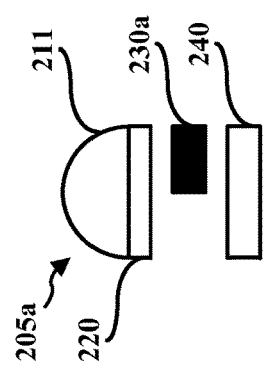

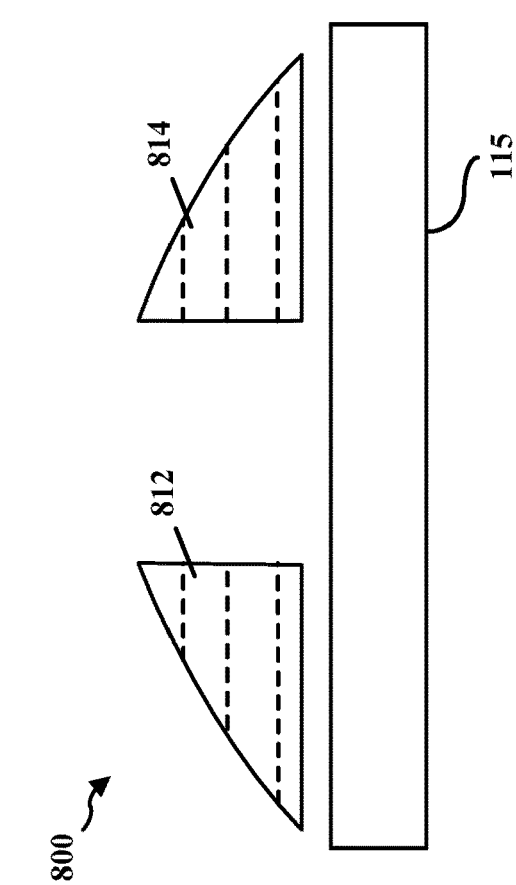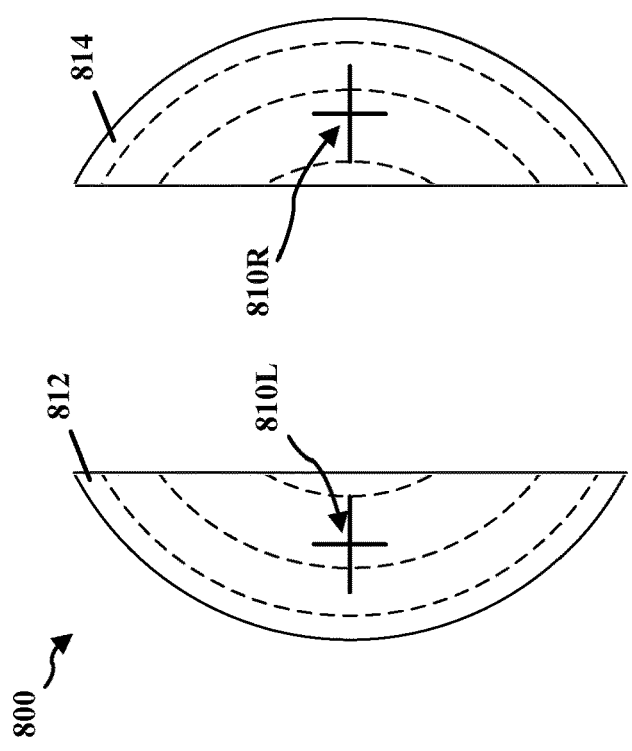
FIG. 8B
FIG. 8A

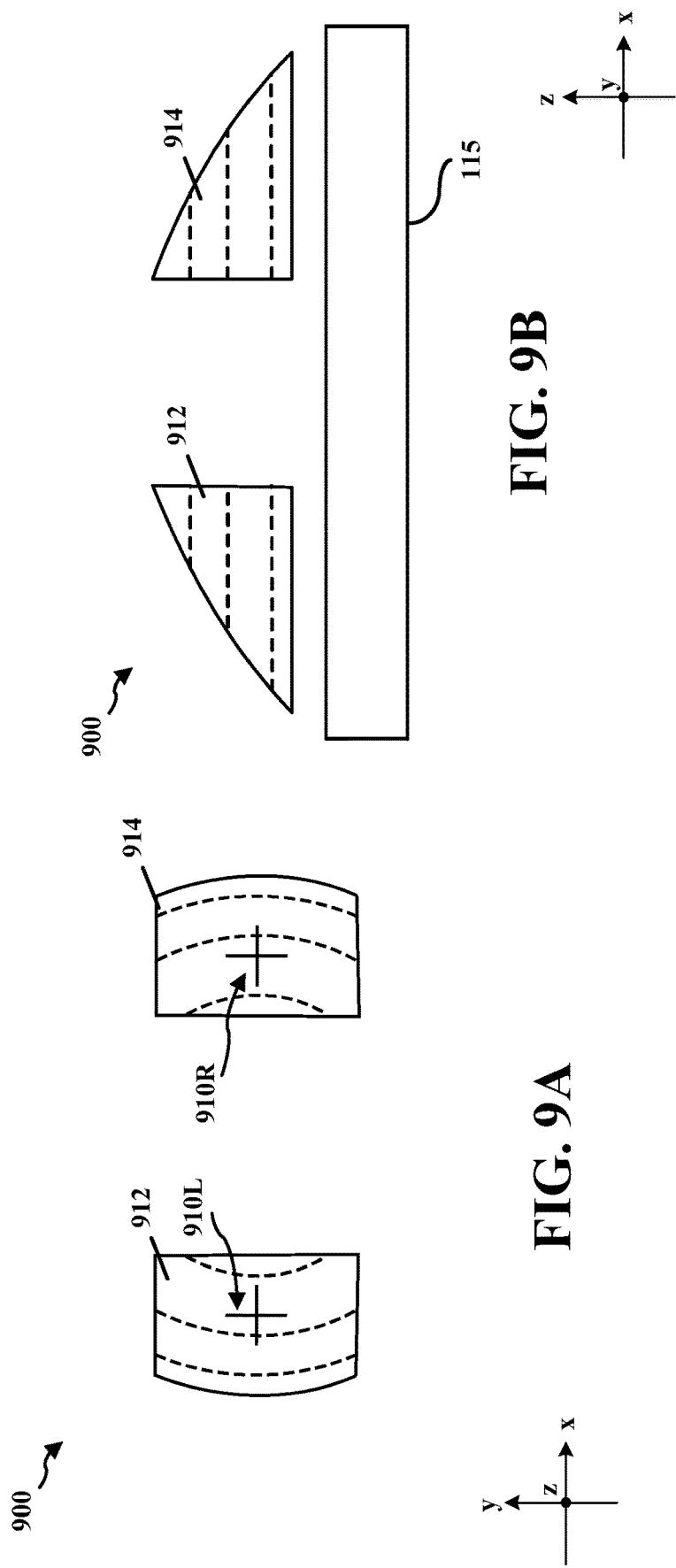

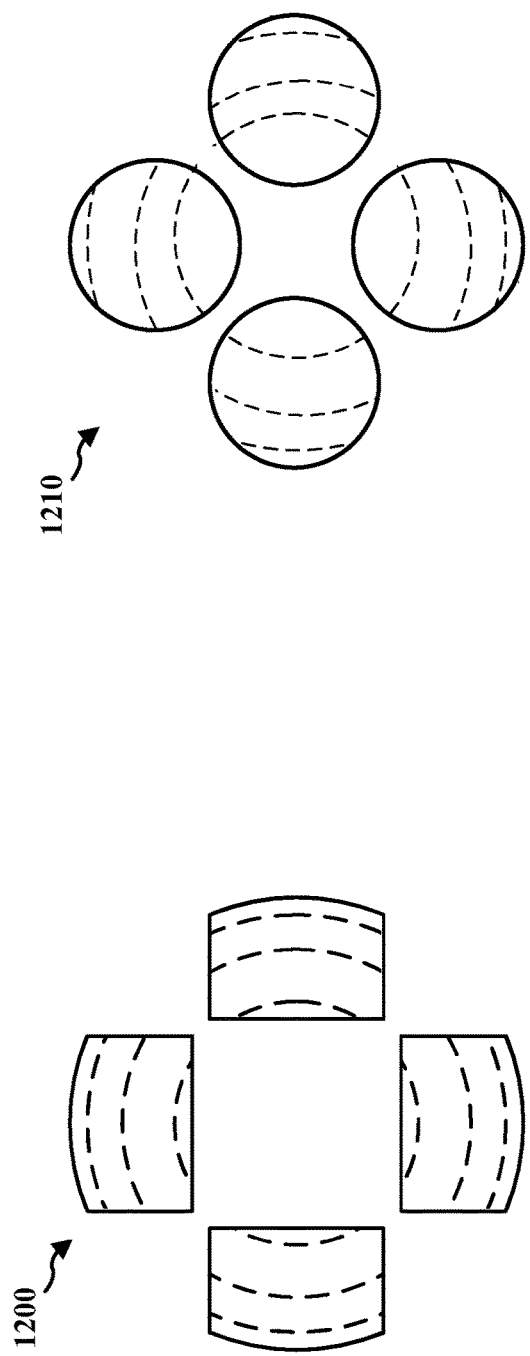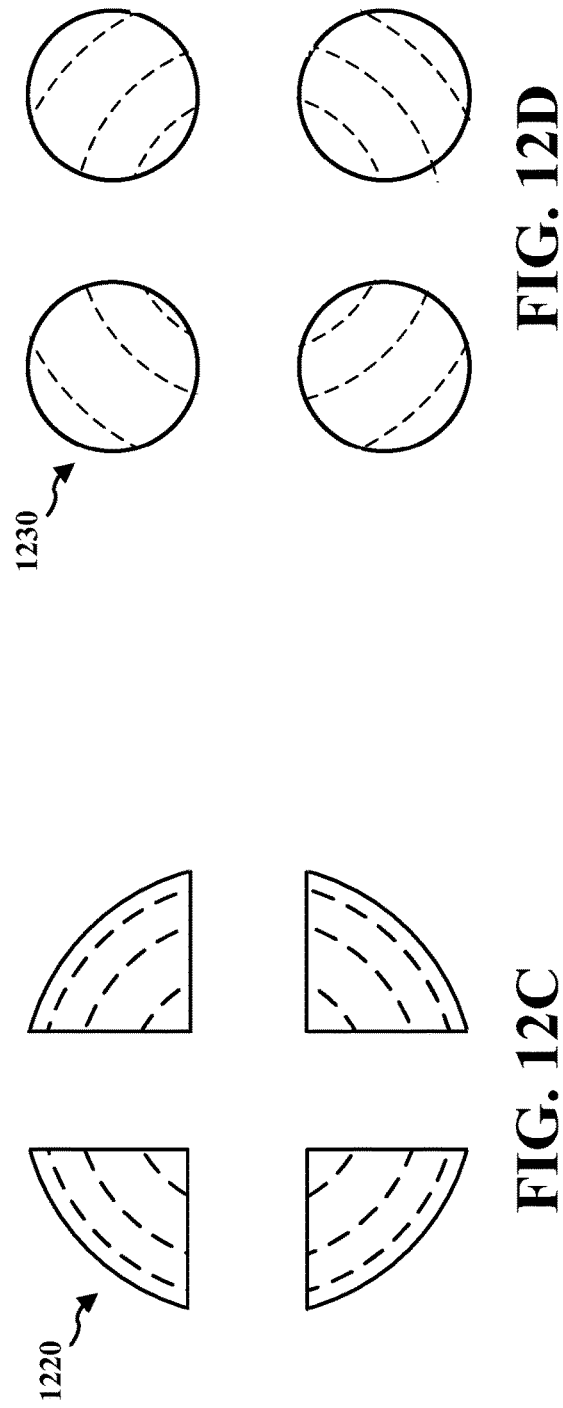
FIG. 12A
FIG. 12B
FIG. 12C
FIG. 12D

PHASE DETECTION AUTOFOCUS (PDAF) OPTICAL SYSTEM

BACKGROUND

Technical Field

The present disclosure relates generally to phase detection autofocus (PDAF), and more particularly, to an optical system optimized for PDAF.

INTRODUCTION

Image capture devices, such as digital cameras and mobile devices (e.g., smartphones, tablets, laptops, etc.) include an imaging system that includes an imaging sensor positioned downstream of one or more optical components. Typical optical components may include one or more lenses and apertures. The optical components direct light of a scene onto the imaging sensor. A processor processes the data captured by the imaging sensor to record an image. To record a clear image, the optical components focus light from the scene onto the imaging sensor. If the light is out of focus at the plane of the imaging sensor, then the imaging sensor may capture a blurry image. Some image capture devices use phase detection autofocus (PDAF) sensors to perform autofocus. PDAF sensors may include an array of pixels. The array of pixels may include one or more focus pixels (also referred to as "phase detection pixels").

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. An example apparatus a phase detection auto focus (PDAF) sensor including a plurality of focus pixels and a plurality of micro lenses. The example apparatus also includes an optical system located above the PDAF sensor and configured to direct light to the micro lenses of the PDAF sensor. The example optical system configured may be to include at least one circular asymmetric subsection of a lens. In some examples, the lens may be at least one of a spherical lens, an aspherical lens, a cylindrical lens, or a Fresnel lens. In some examples, the optical system may include a plurality of lens subsections of at least one of a spherical lens, an aspherical lens, a cylindrical lens, or a Fresnel lens. In some examples, at least one lens subsection of the optical system may be one of rectangular or circular. In some examples, at least one lens subsection of the optical system may be configured to be located at a same location to a corresponding subsection of the lens. In some examples, at least one lens subsection of the optical system may be configured to be located at a different location from a corresponding subsection of the lens. In some examples, the plurality of focus pixels may include a subset of visible light PDAF pixels and a subset of infrared (IR) light PDAF pixels. In some examples, the apparatus may also include an infrared (IR) light emitter. In some examples, the optical system may also include a filter configured to filter out visible light. In some examples, the apparatus may also include a compound lens including two or more lens elements, and where the optical system may be configured to be at least one of the lens elements.

Another example apparatus includes an infrared (IR) light emitter. The example apparatus also includes an optical system located above a phase detection auto focus (PDAF) sensor and configured to direct light to micro lenses of the PDAF sensor. The example optical system may be configured to include at least one circular asymmetric subsection of a lens. The example PDAF sensor may be configured to include at least a set of focus pixels and a set of IR PDAF pixels. The example set of IR PDAF pixels may be configured to receive IR light emitted by the IR light emitter. In some examples, the lens may be at least one of a spherical lens, an aspherical lens, a cylindrical lens, or a Fresnel lens. In some examples, the optical system may include a plurality of lens subsections of at least one of a spherical lens, an aspherical lens, a cylindrical lens, or a Fresnel lens. In some examples, at least one lens subsection of the optical system may be one of rectangular or circular. In some examples, the lens subsections of the optical system may be configured to be located at same respective locations to corresponding subsections of the lens. In some examples, at least one lens subsection of the optical system may be configured to be located at a different location from a corresponding subsection of the lens. In some examples, the optical system may also include a filter configured to filter out visible light. In some examples, the apparatus may also include a compound lens including two or more lens elements, and where the optical system may be configured to be at least one of the lens elements.

Another example apparatus includes a phase detection auto focus (PDAF) sensor including a plurality of focus pixels and a plurality of micro lens. The example apparatus also includes an optical system located above the PDAF sensor and configured to direct light to the micro lenses of the PDAF sensor. The example optical system may be configured to include at least one circular asymmetric subsection of a lens. The example apparatus also includes an aperture configured to adjust an amount of light received at the optical system. In some examples, the lens may be at least one of a spherical lens, an aspherical lens, a cylindrical lens, or a Fresnel lens. In some examples, the optical system may include a plurality of lens subsections of at least one of a spherical lens, an aspherical lens, a cylindrical lens, or a Fresnel lens. In some examples, at least one lens subsection of the optical system may be one of rectangular or circular. In some examples, at least one lens subsection of the optical system may be configured to be located at a same location to a corresponding subsection of the lens. In some examples, at least one lens subsection of the optical system may be configured to be located at a different location from a corresponding subsection of the lens. In some examples, the plurality of focus pixels may include a subset of visible light PDAF pixels and a subset of infrared (IR) light PDAF pixels. In some examples, the apparatus may also include an infrared (IR) light emitter. In some examples, the optical system may also include a filter configured to filter out visible light.

Another example apparatus includes a phase detection auto focus (PDAF) sensor including a plurality of focus pixels and a plurality of micro lenses. The example apparatus also includes an optical system located above the PDAF sensor and configured to direct light to the micro lenses of the PDAF sensor. The example optical system also a lens and an opaque element configured to block light through the lens except for at least one circular asymmetric subsection of the lens. In some examples, the lens may be at least one of a spherical lens, an aspherical lens, a cylindrical lens, or a Fresnel lens. In some examples, the at least one circular asymmetric subsection may include a plurality of lens subsections, and the opaque element may be configured to block light through the lens except for the plurality of lens subsections. In some examples, the at least one circular asymmetric subsection of the lens may be one of rectangular or circular. In some examples, the plurality of focus pixels may comprise a subset of visible light PDAF pixels and a subset of infrared (IR) light PDAF pixels. In some examples, the apparatus may also include an infrared (IR) light emitter. In some examples, the optical system may also include a filter configured to filter out visible light through the at least one circular asymmetric subsection of the lens. In some examples, the apparatus may also include a compound lens including two or more lens elements, and where the optical system may be configured to be at least one of the lens elements.

Another example apparatus includes an infrared (IR) light emitter. The example apparatus also includes an optical system located above a phase detection auto focus (PDAF) sensor and configured to direct light to micro lenses of the PDAF sensor. The example optical system also includes a lens and an opaque element configured to block light through the lens except for at least one circular asymmetric subsection of the lens. The example PDAF sensor is configured to include at least a set of focus pixels and a set of IR PDAF pixels, and the set of IR PDAF pixels are configured to receive IR light emitted by the IR light emitter. In some examples, the lens may be at least one of a spherical lens, an aspherical lens, a cylindrical lens, or a Fresnel lens. In some examples, the at least one circular asymmetric subsection may include a plurality of lens subsections, and the opaque element may be configured to block light through the lens except for the plurality of lens subsections. In some examples, each of the at least one circular asymmetric subsection of the lens may be one of rectangular or circular. In some examples, the optical system may further include a filter configured to filter out visible light through the at least one circular asymmetric subsection of the lens. In some examples, the apparatus may also include a compound lens including two or more lens elements, and where the optical system may be configured to be at least one of the lens elements.

Another example apparatus includes a phase detection auto focus (PDAF) sensor including a plurality of focus pixels and a plurality of micro lenses. The example apparatus also includes an optical system located above the PDAF sensor and configured to direct light to the micro lenses of the PDAF sensor. The example optical system also includes a lens and an opaque element configured to block light through the lens except for at least one circular asymmetric subsection of the lens. The example apparatus also includes an aperture configured to adjust an amount of light received at the optical system. In some examples, the lens is at least one of a spherical lens, an aspherical lens, a cylindrical lens, or a Fresnel lens. In some examples, the at least one circular asymmetric subsection may include a plurality of lens subsections, and the opaque element may be configured to block light through the lens except for the plurality of lens subsections. In some examples, the at least one circular asymmetric subsection of the lens is one of rectangular or circular. In some examples, the plurality of focus pixels of the PDAF sensor may be configured to include a subset of visible light PDAF pixels and a subset of infrared (IR) light PDAF pixels. In some examples, the apparatus also includes an infrared (IR) light emitter. In some examples, the optical system also includes a filter configured to filter out visible light through the at least one circular asymmetric subsection of the lens. In some examples, the apparatus may also include a compound lens including two or more lens elements, and where the optical system may be configured to be at least one of the lens elements.

Another example apparatus includes a PDAF sensor including a plurality of focus pixels, each focus pixel including a micro lens. The example apparatus also includes an optical system located above the PDAF sensor and configured to direct light to the micro lenses of the PDAF sensor. The optical system may include a first optical component and a second optical component, the first optical component and the second optical component configured to have different filter operations on light. In some examples, the first optical component may be configured to pass or to block a first type of light and the second optical component may be configured to pass or to block a second type of light. In some examples, the lens may be one of a spherical lens, a cylindrical lens, or a Fresnel lens. In some examples, the first optical component may be configured to pass both IR light and visible light, and the second optical component may include an opaque material adjacent to the first optical component and configured to block both IR light and visible light. In some examples, the second optical component may be one of a film on the lens or a shutter configured to move in front of or behind the lens. In some examples, the apparatus may include an IR light emitter located adjacent the lens. In some examples, the first optical component may include one or more portions of the lens that is one of rectangular or circular. In some examples, the first optical component may be circular and has an interior radius r1 and an exterior radius r2, and the second optical component may be circular, is interior to the first optical component, and has a radius r1. In some examples, the first optical component may include a first lens coating configured to pass IR light and to block visible light, and the second optical component may be configured to pass visible light. In some examples, the second optical component may include a second lens coating configured to block IR light. In some examples, the plurality of focus pixels may include a first subset of visible light PDAF pixels and a second subset of IR light PDAF pixels.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 2A illustrates an example of an imaging sensor suitable for use in the image capture device of FIG. 1, in accordance with certain aspects of this disclosure.

FIG. 2B is an exploded view of a focus pixel of FIG. 2A, as viewed along section line 2A-2A of FIG. 2A, in accordance with certain aspects of this disclosure.

FIG. 2C illustrates an alternative means for capturing data including phase disparity information, in accordance with certain aspects of this disclosure.

FIG. 2D illustrates a top view of a lens, in accordance with certain aspects of this disclosure.

FIG. 2E illustrates a side view of the lens of FIG. 2D, as viewed along section line 2D-2D of FIG. 2D, in accordance with certain aspects of this disclosure.

FIG. 8A illustrates a top view of a fourth example optical system, in accordance with certain aspects of this disclosure.

FIG. 8B illustrates a side view of the fourth example optical system of FIG. 8A, in accordance with certain aspects of this disclosure.

FIG. 9A illustrates a top view of a fifth example optical system, in accordance with certain aspects of this disclosure.

FIG. 9B illustrates a side view of the fifth example optical system of FIG. 9A, in accordance with certain aspects of this disclosure.

FIG. 12A illustrates a top view of an eighth example optical system, in accordance with certain aspects of this disclosure.

FIG. 12B illustrates a top view of a ninth example optical system, in accordance with certain aspects of this disclosure.

FIG. 12C illustrates a top view of a tenth example optical system, in accordance with certain aspects of this disclosure.

FIG. 12D illustrates a top view of an eleventh example optical system, in accordance with certain aspects of this disclosure.

DETAILED DESCRIPTION

Figure 1:
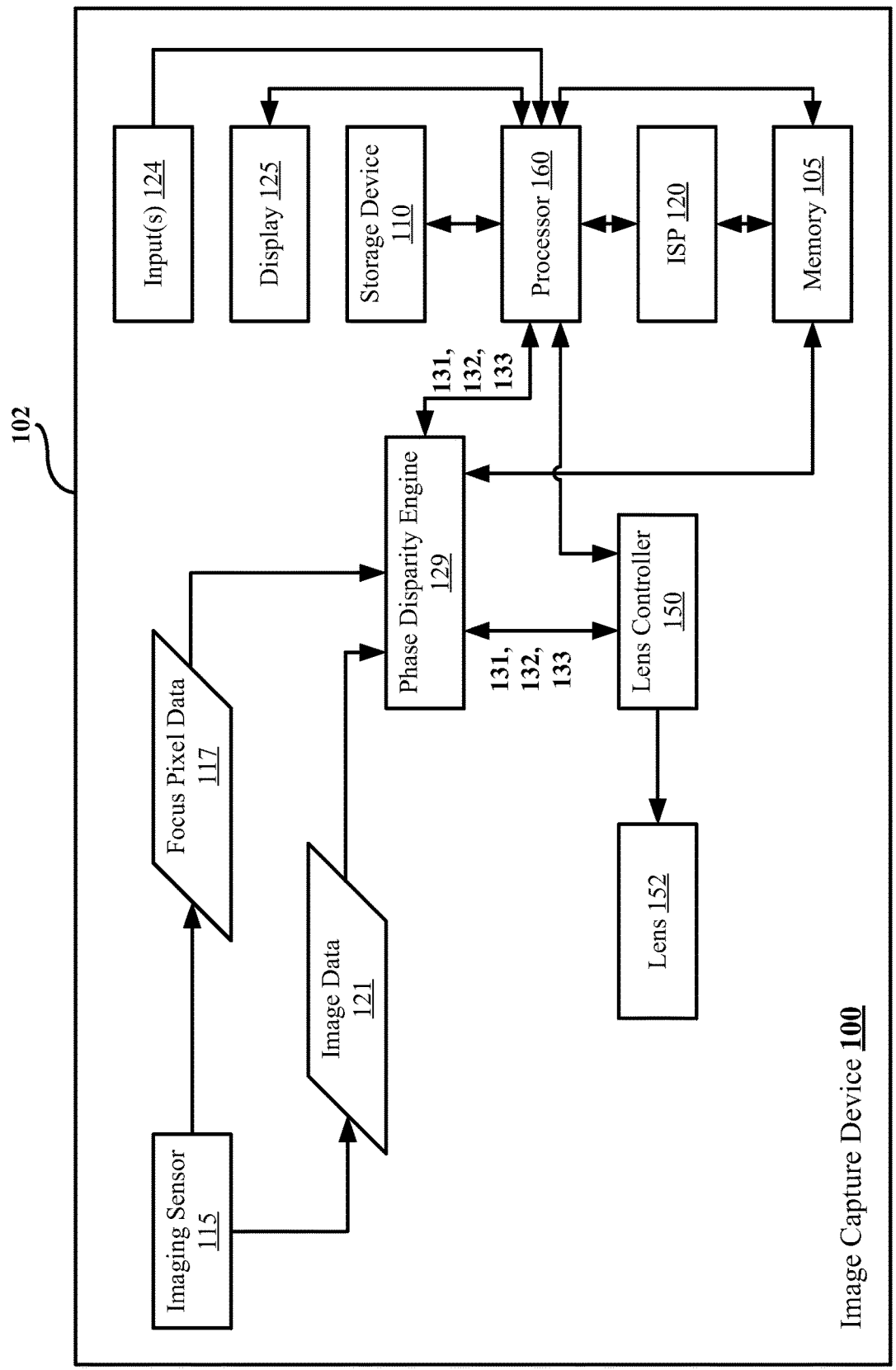
FIG. 1 is a block diagram of an example image capture device, in accordance with certain aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

In general, example techniques disclosed herein are directed to generating depth (e.g., depth maps) using a PDAF system of an image capture device. For a PDAF system, a phase disparity signal is derived by the phase difference between phase detection pixels distributed among imaging pixels in an imaging sensor (e.g., a PDAF sensor). The distributed phase detection pixels may be provided in pairs, for example, left-right pairs or up-down pairs. When light from a region of interest (ROI) is focused in the plane of the imaging sensor, the phase disparity is zero. When light from the ROI is not focused in the plane of the imaging sensor, the phase disparity may be proportional to the distance a primary lens should be moved to bring the light from the ROI into focus at the plane of the imaging sensor.

Phase detection pixels may be configured to generate asymmetric blur shapes. For example, a blur caused by a first phase detection pixel (e.g., a left phase detection pixel) may have a different shape than a blur caused by a second phase detection pixel (e.g., a right phase detection pixel). In some examples, when the respective asymmetric blur shapes are applied over a captured scene, the resulting image may yield an offset between the respective asymmetric blur shapes that is proportional to an amount of defocus. In some examples, comparing the disparity between the first phase detection pixel image and the second phase detection pixel detection image may correlate with the amount of defocus. In addition, the accuracy of the disparity measurement may facilitate accurate depth extraction (e.g., to generate a depth map). For example, a PDAF system may apply a sub pixel accuracy threshold (e.g., a minimum sub pixel accuracy percentage) in order to meet respective auto-focus requirements. For example, the sub pixel accuracy threshold may be below ¼ of pixel size. However, it should be appreciated that other examples may use additional or alternative sub pixel accuracy thresholds. In some examples, a large aperture optical system may yield larger disparity and therefore may provide relatively more accurate depth estimation than a small aperture optical system. However, the relatively large blur resulting from the large aperture optical system may cause image details to be lost and, thus, may reduce the ability of the PDAF system to correlate between the image pair (e.g., the image of the first phase detection pixel and the image of the second phase detection pixel) in case of, for example, high frequencies and/or low contrast regions. Thus, it should be appreciated that improving PDAF depth sensing (e.g., the ability of the PDAF system to correlate between the image pair) may be facilitated by shifting the center of mass of the respective blurs to increase distance between the respective center of masses, while also reducing the overall size of the blur (e.g., to retain details of the captured scene).

Example techniques disclosed herein are directed to image capture devices optimized for PDAF depth sensing. The example techniques may achieve relatively higher phase disparity between the phase detection pixels in a cost effective manner. Other example benefits are described throughout this disclosure.

Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different wireless technologies, system configurations, networks, and transmission protocols, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors (which may also be referred to as processing units). Examples of processors include microprocessors, microcontrollers, graphics processing units (GPUs), general purpose GPUs (GPGPUs), central processing units (CPUs), application processors, digital signal processors (DSPs), reduced instruction set computing (RISC) processors, systems-on-chip (SOC), baseband processors, application specific integrated circuits (ASICs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software can be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise. The term application may refer to software. As described herein, one or more techniques may refer to an application, i.e., software, being configured to perform one or more functions. In such examples, the application may be stored on a memory, e.g., on-chip memory of a processor, system memory, or any other memory. Hardware described herein, such as a processor, may be configured to execute the application. For example, the application may be described as including code that, when executed by the hardware, causes the hardware to perform one or more techniques described herein. As an example, the hardware may access the code from a memory and execute the code accessed from the memory to perform one or more techniques described herein. In some examples, components are identified in this disclosure. In such examples, the components may be hardware, software, or a combination thereof. The components may be separate components or sub-components of a single component.

Accordingly, in one or more examples described herein, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a block diagram of an example image capture device 100. The image capture device 100 may provide advantages in many different types of portable and stationary computing devices. The image capture device 100 may be a special-purpose camera or a multi-purpose device capable of performing imaging and non-imaging applications. For example, the image capture device 100 may be a portable personal computing device, such as a cellular phone, a smart phone, a laptop, a personal digital assistant (PDA), a multimedia device, a video device, a camera, a game console, a tablet, a smart device, a wearable device, a vehicle, an autonomous vehicle, a surveillance camera, a healthcare device, etc. The example image capture device 100 may facilitate virtual reality (VR) systems, augmented reality (AR) systems, gesture recognition systems, background removal systems, and/or skeleton tracking systems.

In the illustrated example of FIG. 1, the image capture device 100 includes an imaging sensor 115. The image capture device 100 of FIG. 1 includes at least one processor (s) 160 in communication with the imaging sensor 115 for capturing images. In the illustrated example of FIG. 1, the processor 160 is also in communication with a memory 105, a storage device 110 (e.g., a computer readable medium), and an electronic display 125.

As used herein, the term computer-readable medium is expressly defined to include any type of computer readable storage device and/or storage disk and to exclude propagating signals and to exclude transmission media. As used herein, "computer-readable medium," "machine-readable medium," "computer-readable memory," and "machine-readable memory" are used interchangeably.

The example imaging sensor 115 (sometimes referred to herein as a "PDAF sensor") may be a complementary metal oxide semiconductor (CMOS) imaging sensor or a charge-coupled device (CCD) sensor. The example imaging sensor 115 of FIG. 1 includes a plurality of focus pixels (or "phase detection pixels") for outputting phase disparity data (e.g., focus pixel data 117).

There are many different types of focus pixel patterns and/or arrangements that may be included within an imaging sensor (e.g., the imaging sensor 115). For example, and as will be discussed in further detail below, focus pixels may include masks to limit the amount and/or direction of light that strikes focus pixel diodes, focus pixels may include dual photodiode (2PD) focus pixels where each 2PD focus pixel includes two diodes, focus pixels may include an on-chip lens (OCL), such as a micro lens extending over two or more focus pixel diodes, that may limit the amount and/or direction of light that strikes focus pixel diodes.

In some examples, the imaging sensor 115 may include one or more focus pixels (e.g., one or more pixels with a mask or metal shielding) that are masked to limit light from striking a diode of the focus pixel from a particular direction. In some examples, a first mask or metal shielding may be disposed over a first focus pixel diode and a second mask or metal shielding may be disposed over a second focus pixel diode in an opposite direction than the first mask to produce a pair of left and right images (e.g., focus pixel diodes may receive 50% of light due to the half-apertures created by the masks or metal shielding). It should be appreciated that the imaging sensor 115 may include any reasonable quantity of focus pixels.

In some examples, left and right pairs of focus pixels may be adjacent to one another or may be spaced apart by one or more imaging pixels (e.g., imaging diodes that, in this example, are not masked and, thus, may receive 100% of light). In some examples, left and right pairs of focus pixels may be in a same row of the imaging sensor 115, may be in a same column of the imaging sensor 115, may be in different rows of the imaging sensor 115, or may be in different columns of the imaging sensor 115.

It should be appreciated that while the above description of the imaging sensor 115 includes left and right pairs of focus pixels, in other examples, the imaging sensor 115 may additionally or alternatively include up and down pairs of focus pixels. For example, the mask or metal shielding of focus pixels may mask top and bottom portions of the respective focus pixel diodes, which may generate up and down (or top and bottom) pairs of images.

In some examples, the focus pixels may include dual photodiode (2PD) pixels where each focus pixel includes two diodes (e.g., a first photodiode and a second photodiode adjacent to the first photodiode). In some examples, the imaging sensor 115 may include one or more 2PD focus pixels including a left diode and a right diode. In some such examples, the left diode may generate a left image and the right diode may generate a right image. In some examples, the imaging sensor 115 may include all 2PD focus pixels (e.g., without any imaging pixels including a single photodiode). In some examples, the imaging sensor 115 may include sparse 2PD focus pixels. For example, the imaging sensor 115 may include a pixel array including a first subset of imaging pixels including a single photodiode and a second subset of 2PD focus pixels. In some such examples, the 2PD focus pixels may be arranged in any manner (e.g., adjacent to one another, spaced apart from one another, etc.). In some examples, the focus pixels of the pixel array of the imaging sensor 115 may be left-right pairs of focus pixels or up-down pairs of focus pixels. In some examples, the imaging sensor 115 may include a combination of left-right pairs of focus pixels and up-down pairs of focus pixels.

In some examples, the imaging sensor 115 may include 4PD focus pixels where each focus pixel includes four photodiodes (sometimes referred to as "quad-PD" or QPD" pixels). In some such examples, the 4PD focus pixels may generate two pairs of images (e.g., a pair of left-right images and a pair of up-down images).

In some examples, the imaging sensor 115 may include all 4PD focus pixels (e.g., without any imaging pixels including a single photodiode). In some examples, the imaging sensor 115 may include sparse 4PD focus pixels such that a subset of the focus pixels of the pixel array of the imaging sensor 115 are 4PD focus pixels arranged in any manner (e.g., adjacent to one another, spaced apart from one another, etc.). In some such examples, one or more remaining pixels of the pixel array may be imaging pixels and/or 2PD focus pixels.

In some examples, focus pixels may include an on-chip lens (OCL), such as a micro lens, which may limit the amount and/or direction of light that reaches the focus pixels. In some examples, the imaging sensor 115 may include one or more on-chip lenses. In some examples, the on-chip lenses may span a quantity of adjacent pixels, such that a pair of images may be generated. For example, a single OCL may span four pixels (e.g., a 2×2 OCL) so that two pairs of images may be generated (e.g., a pair of left-right images and a pair of up-down images). In some examples, a single OCL may span 2 pixels (e.g., a 2×1 OCL) so that a pair of left-right images may be generated or a pair of up-down images may be generated. It should be appreciated that any suitable quantity of focus pixels may be included within the pixel array and a mix of OCLs spanning four pixels and/or two pixels may be included. Furthermore, it should be appreciated that the imaging sensor 115 may include higher-order OCLs, such as 3×3 OCLs, 4×4 OCLs, etc.

Once pairs of images have been generated for each focus pixel (e.g., a pair of left-right images and/or a pair of up-down images), the images may be compared with one another. For example, phase differences between signals generated from the left focus pixel (e.g., the left image) and the right focus pixel (e.g., the right image) may be compared and a separation error (e.g., a phase disparity) between the signals may be determined. A depth map may then be generated based on the focus pixels and the measured phase disparity.

In some examples, the focus pixels include at least two types of masked focus pixels described in connection with FIGS. 2A and 2B. For example, a first type of masked focus pixel may include a mask covering a first portion (e.g., a left side) of a photodiode of the focus pixel and a second type of masked focus pixel may include a mask covering a second, different portion (e.g., a right side) of a photodiode of the focus pixel.

The example image capture device 100 of FIG. 1 includes a lens controller 150 and a primary focusing mechanism including a lens 152. In some examples, the positioning of the lens 152 may be adjustable based at least partly on data received from the processor 160 to produce a focused image of a region of interest (ROI) in a target image. It should be appreciated that the lens 152 may include any number of optical elements.

The processor 160 may include one or more processors, such as a general purpose processor, an image signal processor (ISP) 120, a digital signal processor (DSP) (not shown), and/or a phase disparity (PD) engine 129. In some examples, the processor 160 may include a single central processing unit that performs image signal processing, PD computation, and other operations. The processor 160, the ISP 120, and/or the PD engine 129 may include one or more dedicated processors or a software implementation programmed on a general purpose processor. In some examples, the imaging sensor 115 can be configured to perform one or more of the phase disparity operations. In some examples, the processor 160, the ISP 120, and/or the PD engine 129 may be implemented in application specific integrated circuits (ASIC) or in a programmable gate array (PGA).

In the illustrated example of FIG. 1, the ISP 120 facilitates controlling image capture functions, such as autofocus, auto-white balance, and/or auto-exposure. The example ISP 120 may be a general purpose processing unit or a processor specially designed for imaging applications. In some examples, the ISP 120 may also facilitate performing post-processing functions, such as depth mapping and/or Bokeh effect. In some examples, the ISP 120 may perform depth mapping via triangulation using a left focus pixel and a right focus pixel to determine the respective distance between the imaging sensor 115 and each point in a field of view. In some examples, the ISP 120 may add a Bokeh effect to an out-of-focus portion of an image (which can produce circles at the locations of points of light in the out-of-focus portion of the image). In some examples, the ISP 120 may also facilitate performing cropping, scaling (e.g., to a different resolution), image stitching, image format conversion, color interpolation, color processing, image filtering (e.g., spatial image filtering), lens artifact or defect correction, sharpening, or the like.

In the illustrated example of FIG. 1, the processor 160, the ISP 120, and the PD engine 129 are in communication with the memory 105, which may include an instruction memory for storing instructions and a working memory. The example memory 105 may include a variety of components that configure the one or more processors 160, 120, 129 to perform various image processing and device management tasks, such as the operations of the phase disparity engine 129. In some examples, the memory 105 may include specialized memory components for particular types of operations or data. For example, the memory 105 may include an instruction memory comprising flash memory, and a working memory comprising dynamic random access memory (DRAM).

In the illustrated example of FIG. 1, the phase disparity engine 129 provides a means for computing phase disparity data for an image frame of an image. In some examples, the phase disparity engine 129 may provide PD data for a variety of image capture and/or processing functions. For example, the phase disparity engine 129 may provide PD data to the ISP 120 for performing autofocus, automatic white balance, automatic exposure, depth mapping, and/or adding Bokeh effect. In some examples, the PD data may include an individual PD value 131 and confidence level 132 for a pair of focus pixels, and/or a PD map 133 of PD data for one or more focus pixels of the imaging sensor 115. In some examples when the imaging sensor 115 is capable of providing full density phase disparity data (e.g., full density meaning the majority of pixels of the imaging sensor 115 are focus pixels), the PD map 133 may include respective PD data for each respective imaging pixel.

It should be appreciated that if the image capture device 100 is a multi-purpose computing device (e.g., a smartphone, a tablet, a laptop, etc.), the image capture device 100 may include an operating system that acts as an intermediary between programs and the processors 160, 120, 129. In some examples, the operating system may include device drivers to manage hardware resources such as the image capture device 100.

In the illustrated example of FIG. 1, the processor 160 may be configured to control the display 125 to display the captured image or a preview of the captured image to a user. The example display 125 may be external to the image capture device 100 or may be part of the image capture device 100 (as shown in FIG. 1). In some examples, the display 125 may be configured to provide a view finder to display a preview image prior to capturing an image. The example display 125 may include a liquid crystal display (LCD), light emitting diode (LED), or organic light emitting diode (OLED) screen, and may be touch sensitive and serve as an input device. In some examples, the image capture device 100 may additionally or alternatively include input(s) 124, such as buttons, joy sticks, or the like.

The example processors 160, 120, 129 may write data to the storage device 110. The data may include data representing captured images, data generated during phase detection and/or metadata (e.g., exchangeable image file format (EXIF) data). The example storage device 110 may be configured as any type of non-transitory storage media device. For example, the storage device 110 can include a disk drive, such as a hard disk drive (HDD), an optical disk drive or magneto-optical disk drive, or a solid state memory such as flash memory, random access memory (RAM), read-only memory (ROM), and/or electrically-erasable programmable ROM (EEPROM). The example storage device 110 may additionally or alternatively include multiple memory units.

Although the example image capture device 100 of FIG. 1 illustrates separate components to implement the processor 160, the ISP 120, the phase disparity engine 129, the memory 105, and the storage device 110, it should be appreciated that in other examples, one or more of the processor 160, the ISP 120, the phase disparity engine 129, the memory 105, and/or the storage device 110 may be combined in a variety of ways. For example, the memory 105 and/or the storage device 110 may be combined with the processor 160, the ISP 120, and/or the phase disparity engine 129 in a system on a chip (SOC).

It should be appreciated that the image capture device 100 may include one or more additional optical components mounted inside a housing 102 of the image capture device 100 and/or positioned on the housing 102 or the lens 152. For example, the additional optical components may include a motion sensor (e.g., an accelerometer, a gyroscope, etc.), apertures, shutters, mirrors, filters, coatings, etc. Furthermore, it should be appreciated that in some examples, the image capture device 100 may include some of the components shown in FIG. 1 and that not all of the shown components may be required for this disclosure. For example, the display 125 is optional (e.g., in the case of a surveillance camera).

FIGS. 2A to 2E illustrate example means for capturing data including phase disparity information, in accordance with certain aspects of this disclosure. FIG. 2A illustrates an example of an imaging sensor 115 of FIG. 1 suitable for use in the image capture device 100 of FIG. 1. FIG. 2B is an exploded view of a focus pixel 205a as viewed along section line 2A-2A of FIG. 2A. FIG. 2C illustrates an alternative means for capturing data including phase disparity information. FIG. 2D illustrates a top view of an imaging lens 270. FIG. 2E illustrates a side view of the imaging lens 270 as viewed along section line 2D-2D of FIG. 2D.

In the illustrated example of FIG. 2A, the imaging sensor 115 includes a pixel array 201 including a plurality of imaging pixels 210 and a plurality of focus pixels 205a, 205b. The imaging pixels 210 are arranged in a pattern according to their associated color filters. In some examples, the imaging pixels 210 can be red, green, and blue (R, G, and B, respectively, in FIG. 2A) type imaging pixels 210 arranged in a Bayer pattern. In other examples, the imaging pixels 210 may be arranged in a cyan, yellow, green, and magenta pattern, a red, green, blue, and emerald pattern, a cyan, magenta yellow, and white pattern, a red, green, blue, and white pattern, or other pattern. Although FIG. 2A illustrates the imaging sensor 115 with 24 sensing elements (e.g., pixels) for ease of viewing, it should be appreciated that the imaging sensor 115 may have any number of sensing elements (e.g., pixels), such as several million sensing elements (e.g., pixels).

In the illustrated example of FIG. 2B, the example focus pixel 205a includes three components in common with the imaging pixels 210, including a micro lens 211, a color filter 220, and a photodiode 240. The focus pixel 205a also includes a partial mask 230a that prevents light passing through part of the micro lens 211 from reaching the photodiode 240.

In the illustrated examples of FIGS. 2A and 2B, the imaging sensor 115 includes two types of focus pixels 205a, 205b corresponding to partial masks 230a, 230b, respectively. For example, a first type of masked focus pixel includes a mask covering a first portion (e.g., a left side) of a photodiode of the focus pixel and a second type of masked focus pixel includes a mask covering a second, different portion (e.g., a right side) of a photodiode of the focus pixel. The partial masks 230a, 230b are located on opposite sides of the focus pixels 205a, 205b, respectively. In the illustrated example, a first partial mask 230a is located on a right side of the focus pixel 205a, and a second partial mask 230b is located on a left side of the focus pixel 205b. As used herein, the phase detection pixel (e.g., the focus pixel) 205a having a partial mask 230a on the right side is referred to as a "left focus pixel" (e.g., the example focus pixel 205a), because light entering the left portion of the left focus pixel 205a (e.g., to the left of the partial mask 230a) can reach the photodiode 240. Similarly, the phase detection pixel (e.g., the focus pixel) 205b having a partial mask 230b on the left side is referred to as a "right focus pixel" (e.g., the example focus pixel 205b), because light entering the right portion of the right focus pixel 205b (e.g., to the right of the partial mask 230b) can reach the photodiode 240.

It should be appreciated that in some examples, a partial mask may be provided on the upper half of a down focus pixel, and a partial mask may be provided on the bottom half of an up focus pixel.

In the illustrated example of FIG. 2C, a pixel 250 is a type of pixel that may be used to provide full density phase disparity (PD) data (e.g., the pixel 250 is capable of providing image data and PD data). The example pixel 250 includes two photodiodes (e.g., a left photodiode 254a and a right photodiode 254b) per micro lens 252 and, thus, may be referred to as a 2PD (or a focus pixel including a 2×1 OCL). As shown in FIG. 2C, light 260a entering a left side 252L of the micro lens 252 reaches the left photodiode 254a, and light 260b entering a right side 252R of the micro lens 252 reaches the right photodiode 254b. If the light 260a, 260b from a subject is in focus at the plane of the photodiodes 254a, 254b, the light impinging on the photodiodes 254a, 254b is centered at the midpoint between the photodiodes 254a, 254b. If the light 260a, 260b from the subject is out of focus at the plane of the photodiodes 254a, 254b, the light 260a impinges on the left photodiode 254a, and the light 260b impinges on the right photodiode 254b, with a distance between the respective points of peak light intensity (not shown) of the light rays from each stream of incoming light 260a, 260b. In the illustrated example of FIG. 2C, the pixel 250 may provide PD data as well as image data. For example, data associated with the left photodiode 254a and data associated with the right photodiode 254b may be combined to provide image data. A sensor having an array of pixels, where each pixel of the pixel array is the pixel 250, may provide full density PD data. For example, each of the pixels 250 may be capable of providing phase disparity data as each of the pixels 250 include two photodiodes 254a, 254b.

In the illustrated examples of FIGS. 2D and 2E, the example imaging lens 270 may be a lens configured for imaging in the example image capture device 100 (e.g., the lens 152). As shown in FIGS. 2D and 2E, the example imaging lens 270 is positioned above the imaging sensor 115. For example, light passes through the imaging lens 270 prior to striking the imaging sensor 115. It should be appreciated that while the example imaging sensor 115 of FIGS. 2D and 2E is shown as extending beyond the perimeter of the imaging lens 270, in other examples, the shape, positioning and/or size of the imaging sensor 115 relative to the imaging lens 270 may vary. In one example, the shape of the imaging sensor may be generally rectangular, and the size of the imaging sensor may be greater than the size of the imaging lens.

In the illustrated examples of FIGS. 2D and 2E, the imaging lens 270 has circular symmetry around an axis 280. For example, a point on a surface of the imaging lens 270 may be rotated by any arbitrary angle along the axis 280 and map onto itself. It should be appreciated that for a three-dimensional object, such as the imaging lens 270, the term "circular symmetry" may also be referred to as "cylindrical symmetry," "axial symmetry," or "rotational circular symmetry."

In some examples, the imaging lens 270 may be a spherical lens, an aspherical lens, a cylindrical lens, or a Fresnel lens. As shown in FIGS. 2D and 2E, the imaging lens 270 includes a first surface 270a that is convex and a second surface 270b that is planar (e.g., flat). Thus, the example imaging lens 270 may be referred to as a "plano-convex lens."

As used herein, a surface of the imaging lens may be referred to as "convex" when the surface extends (or bulges) away from the other surface of the lens, such as the outer surface of a bowl. As used herein, a surface of the imaging lens may be referred to as "planar" when the surface is flat. As used herein, a surface of the imaging lens may be referred to as "concave" when the surface is depressed toward the other surface of the lens, such as the inner surface of a bowl.

However, it should be appreciated that either surface 270a, 270b of the imaging lens 270 may be convex, concave, or planar. Thus, in some examples, the imaging lens 270 may be biconvex-shaped (e.g., when both surfaces are convex) or may be biconcave-shaped (e.g., when both surfaces are concave). In some examples when one of the surfaces is planar, the imaging lens 270 may be plano-convex shaped (e.g., when a first surface is flat and a second surface is convex (e.g., extending away from the first surface), as shown in FIG. 2E) or may be plano-concave shaped (e.g., when a first surface is flat and a second surface is concave (e.g., depressed toward the first surface)). In some examples, the imaging lens 270 may be convex-concave shaped (sometimes referred to as a "meniscus lens") when a first surface is convex and a second surface is concave. The imaging lens 270 may be a negative meniscus lens when the concave surface is relatively steeper than the convex surface. The imaging lens 270 may be a positive meniscus lens when the convex surface is relatively steeper than the concave surface.

Figure 3:
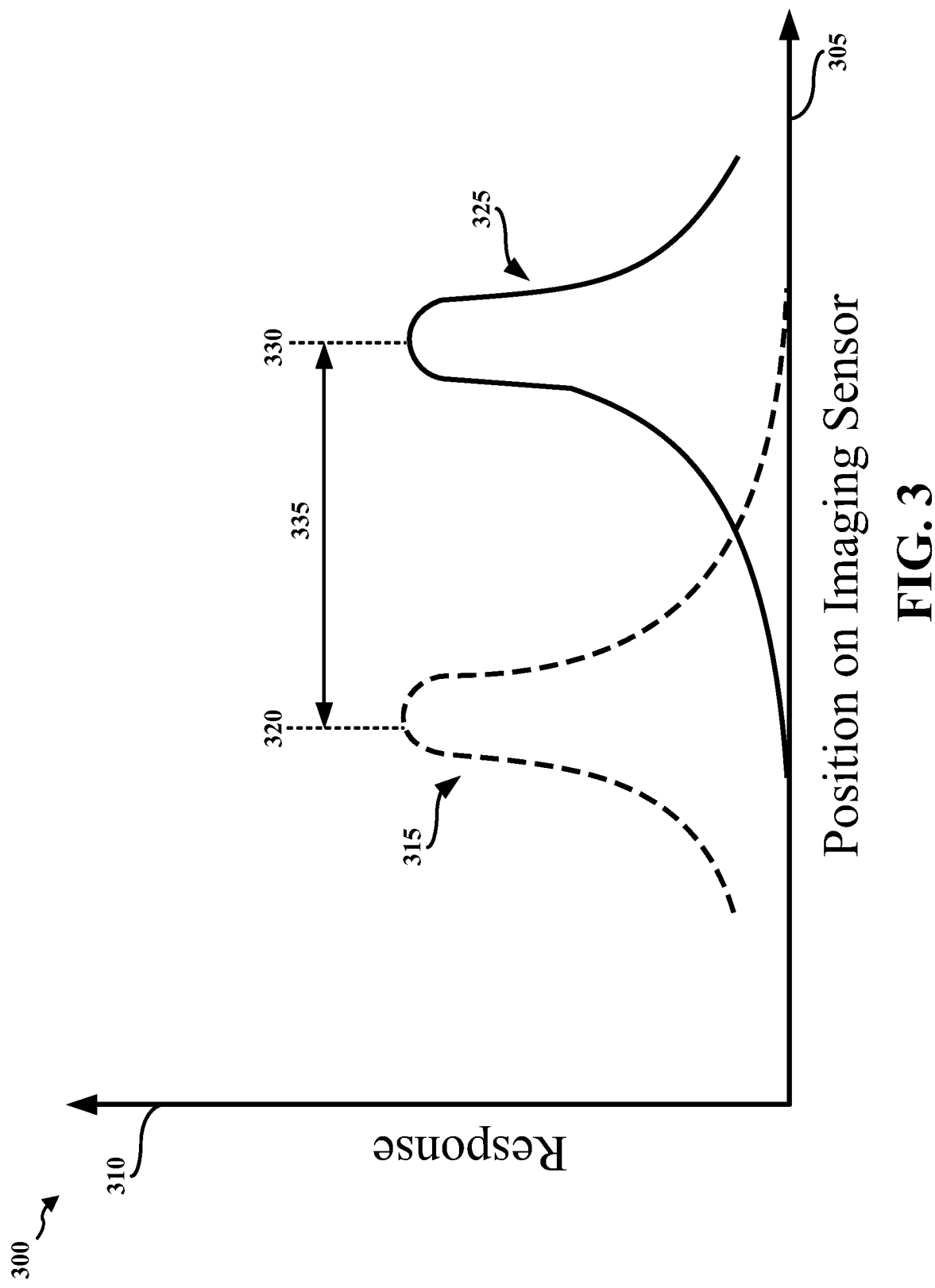
FIG. 3 illustrates an example response for an out-of-focus region of interest, in accordance with certain aspects of this disclosure.

FIG. 3 illustrates an example response 300 of the left and right focus pixels 205a, 205b (in FIG. 2A) or photodiodes 254a, 254b (in FIG. 2C) for an out-of-focus ROI. In the illustrated example of FIG. 3, a horizontal axis 305 of the response 300 corresponds to position along an imaging sensor (e.g., the example imaging sensor 115 of FIG. 1), and a vertical axis 310 of the response 300 corresponds to photodiode response (e.g., luminance measured).

In the illustrated example of FIG. 3, a left light intensity distribution 315 corresponds to a signal generated by the left focus pixel 205a and a right light intensity distribution 325 corresponds to a signal generated by the right focus pixel 205b. As shown in FIG. 3, the light intensity distributions 315, 325 are similar in shape due to overlapping optical information sensed by the respective focus pixels 205a, 205b (in FIG. 2A) or the respective photodiodes 254a, 254b (in FIG. 2C).

In the illustrated example of FIG. 3, the left light intensity distribution 315 includes a left peak 320 that corresponds to a left center-of-mass (COM) point of the luminance measured by the left focus pixel 205a (in FIG. 2A) or the left photodiode 254a (in FIG. 2C). The example right light intensity distribution 325 includes a right peak 330 that corresponds to a right COM point of the luminance measured by the right focus pixel 205b (in FIG. 2A) or the right photodiode 254b (in FIG. 2C).

In the illustrated example of FIG. 3, the response 300 includes a distance 335 between the peaks 320, 330 of the light intensity distributions 315, 325. The example distance 335 corresponds to the phase disparity measured between the respective focus pixels 205a, 205b (in FIG. 2A) or the respective photodiodes 254a, 254b (in FIG. 2C).

Focus pixels (e.g., phase detection pixels or phase disparity pixels) may be used in image capture devices to improve autofocus. For example, when an image is not in focus, focus pixels provide information by analyzing the left focus pixel and the right focus pixel. In some examples, the information collected from the focus pixels may be used to detect phase differences, which may then be used to calculate depth in an image to assist in autofocus. Thus, the performing of depth sensing via the focus pixels in such image capture devices may be characterized as a secondary function of the image capture device.

Example techniques disclosed herein facilitate the improvement of PDAF depth sensing of an image capture device. It should be appreciated that some image capture devices directed to capturing a high resolution image may use certain configurations (or geometries) of the optical system to facilitate capturing the image. For example, an image capture device configured primarily for capturing images may include a lens that is round and an aperture (e.g., an opening for the lens) that is also round. In some such examples, the round shape of the lens and the aperture may be configured to direct light from an image toward the imaging sensor so that a high resolution image may be captured.

As described above, in a PDAF system (e.g., an image capture device including an imaging sensor including focus pixels), the PDAF signal corresponds to the phase disparity between a left image and a right image (e.g., the distance 335 between the peaks 320, 330 of FIG. 3). In some examples, the quality of the PDAF signal may correspond to the measured phase disparity. For example, a first PDAF system may generate a first phase disparity corresponding to a first distance between left and right images generated by the first PDAF system and a second PDAF system may generate a second phase disparity corresponding to a second distance between left and right images generated by the second PDAF system. In some such examples, if the first distance is greater than the second distance, then the first phase disparity that is relatively greater than the second phase disparity may result in a corresponding first PDAF signal that is of relatively higher quality than a corresponding second PDAF signal when performing PDAF depth sensing. Thus, it should be appreciated that examples disclosed herein are directed to techniques for increasing the measured phase disparity between the left image and the right image (or the top image and the bottom image).

Example techniques disclosed herein facilitate using different configurations of the optical system to improve the quality of the PDAF signal. In some examples, the optical system may include one or more subsections of a lens (e.g., one or more subsections or "slices" of a regular lens used for imaging). In some examples, a regular lens used for imaging may be a spherical lens, an aspherical lens, a cylindrical lens, or a Fresnel lens. Thus, the optical system may include one or more subsection of a spherical lens, an aspherical lens, a cylindrical lens, or a Fresnel lens. In some examples, the shape of the one or more subsections of the lens and/or the positioning of the one or more subsections of the of lens relative to the imaging sensor may increase the measured phase disparity between the left image and the right image, thereby improving the quality of the PDAF signal and, thus, the quality of PDAF depth sensing.

Disclosed techniques may use a lens (or subsection(s) of a lens) that is circular asymmetric to improve PDAF depth sensing and provide an optical system that is relatively more cost effective. A circular asymmetric lens may increase the phase disparity between left and right images, which may improve the PDAF depth sensing and resulting autofocus. In some examples, the disclosed techniques may be used in virtual reality (VR) systems, augmented reality (AR) systems, gesture recognition systems, background removal systems, and/or skeleton tracking systems.

Figure 4:
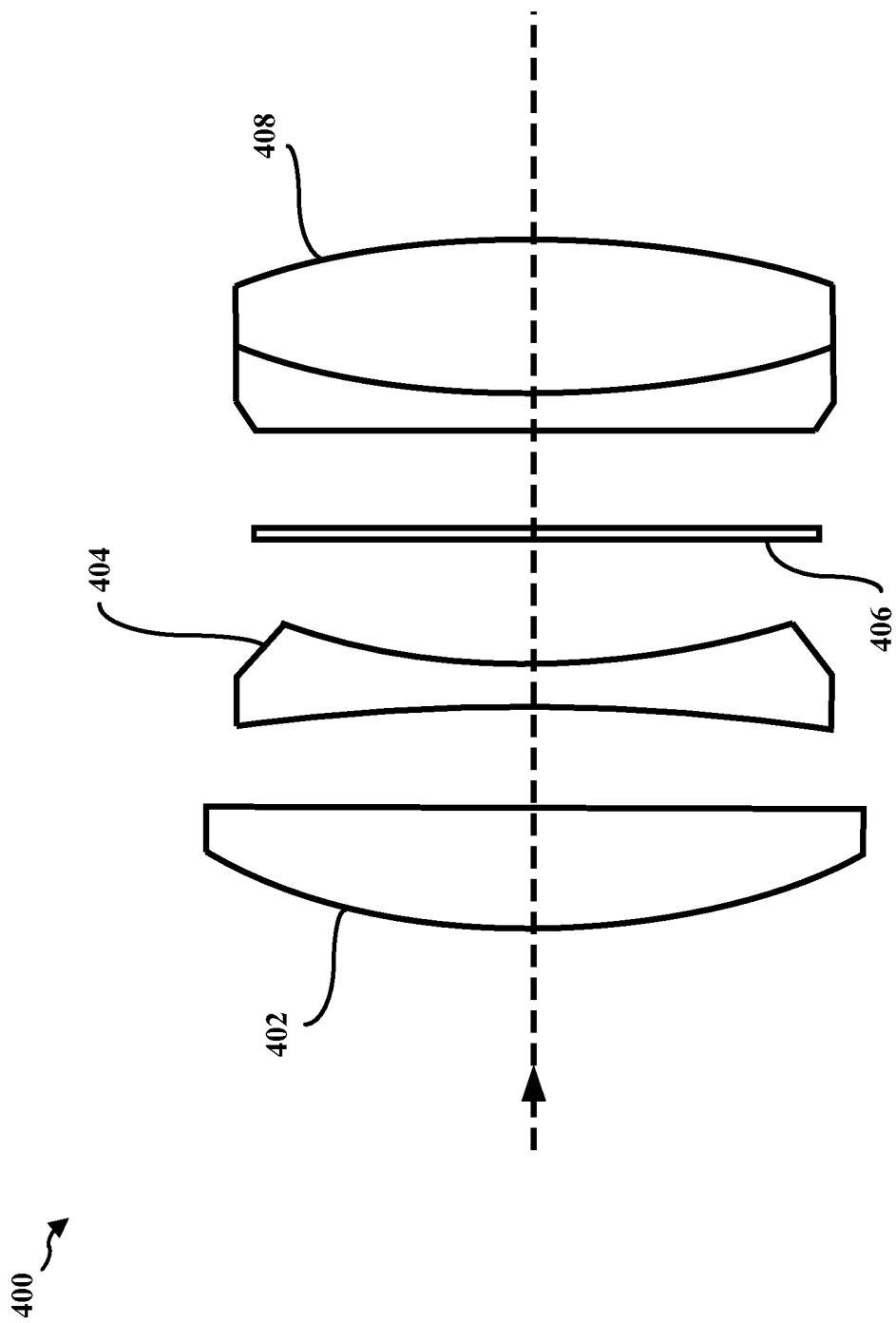
FIG. 4 illustrates an example compound lens, such as in a prime lens, in accordance with certain aspects of this disclosure.

FIG. 4 illustrates an example compound lens 400, such as in a prime lens. The example compound lens 400 of FIG. 4 includes a front lens 402, a secondary lens 404, an aperture 406 for adjusting an amount of light entering the compound lens 400 (where the f-stop is the focal length divided by the aperture), and a rear lens 408. In some examples, the front lens 402 is asymmetric circular such that a rotation by any arbitrary angle would not map back onto itself.

Figure 5B:
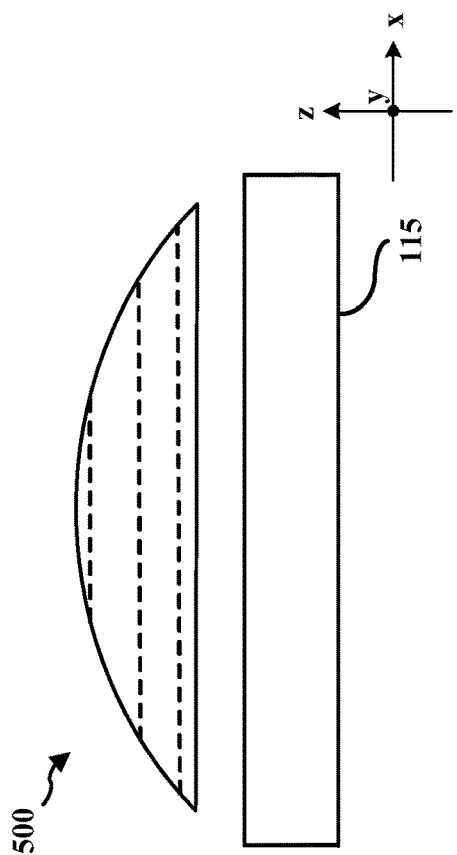
FIG. 5B illustrates a side view of the first example optical system of FIG. 5A, in accordance with certain aspects of this disclosure.
Figure 5A:
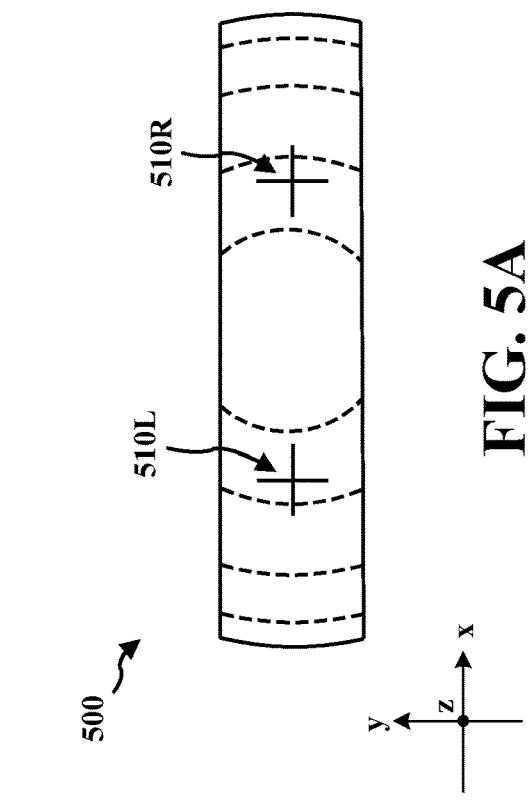
FIG. 5A illustrates a top view of a first example optical system, in accordance with certain aspects of this disclosure.

FIG. 5A illustrates a top view of a first example optical system 500. FIG. 5B illustrates a side view of the first example optical system 500 with a PDAF sensor 115. As shown in FIG. 5B, the optical system 500 is positioned above the imaging sensor 115 and configured to direct light to the imaging sensor 115. In FIGS. 5A and 5B, the optical system 500 is a subsection of a lens, such as, for example, a subsection of the imaging lens 270 of FIGS. 2D and 2E. For example, the optical system 500 may be a slice of the imaging lens 270. Thus, the shape of the optical system 500 may maintain the shape of the corresponding portion of the imaging lens 270. For example, if the imaging lens is a plano-convex lens (as shown in FIGS. 2D and 2E), the optical system 500 may have the same curvature as the corresponding portion of the plano-convex lens. Accordingly, the example optical system 500 retains the light capturing properties associated with the corresponding portion of the imaging lens 270. With the optical system 500 being a subsection of a full lens, center of mass points 510L, 510R increase in distance between each other as compared to the center of mass points of a full lens (e.g., as shown in FIG. 3). The increase in distance between the center of mass points 510L, 510R increases the aforementioned phase disparity, which improves the quality of PDAF depth sensing and, consequently, the autofocus of the PDAF system.

It should be appreciated that since the optical system 500 is a subsection of imaging lens 270, the optical system 500 will not retain the circular symmetry of the full imaging lens (i.e., the optical system 500 is circular asymmetric). As discussed above, a circular symmetric lens can be rotated by any arbitrary angle and map onto itself. That is, any defined curve f(x,z) defining a shape of a lens in the x- and z-directions, with a 360 degree rotation of the curve f(x,z) about a z-axis in the x-y plane to form the remaining surface, would form a surface that has circular symmetry. However, a surface that is circular asymmetric would not have such properties.

In the illustrated example of FIGS. 5A and 5B, the subsection of the lens of the optical system 500 is rectangular shaped so that the optical system 500 is longer in the x-direction than it is wide in the y-direction. However, it should be appreciated that in other example, the subsection of the lens may be any shape or size that is a subsection of a full lens (e.g., the imaging lens 270). As mentioned above, the PDAF system generates a PDAF signal corresponding to phase disparity between two images captured by focus pixels of the imaging system 115. By using the optical system 500 of FIGS. 5A and 5B, the measured light increases the separation between the left COM point 510L and the right COM point 510R (as shown in FIG. 5A). Accordingly, the quality of the PDAF signal generated via the optical system 500 may be relatively stronger than the PDAF signal generated by, for example, the imaging lens 270 of FIGS. 2D and 2E. With a relatively stronger PDAF signal, the PDAF depth sensing and the autofocus functionality of the PDAF system is improved.

The optical system 500 of FIGS. 5A and 5B is illustrated with a length in the x-direction that is relatively greater than a width in the y-direction. Such orientation improves a horizontal phase disparity of the PDAF signal, which would improve the horizontal autofocus. As used herein, the term "horizontal phase disparity" refers to instances in which the focus pixels are left-right focus pixels that generate a pair of left-right images. Alternatively, the optical system 500 may have a width in the y-direction that is relatively greater than a length in the x-direction. Such an optical system 500 would improve a vertical phase disparity of the PDAF signal, which would improve the vertical autofocus. As used herein, the term "vertical phase disparity" refers to instances in which the focus pixels are up-down focus pixels that generate a pair of up-down images.

Figure 5C:
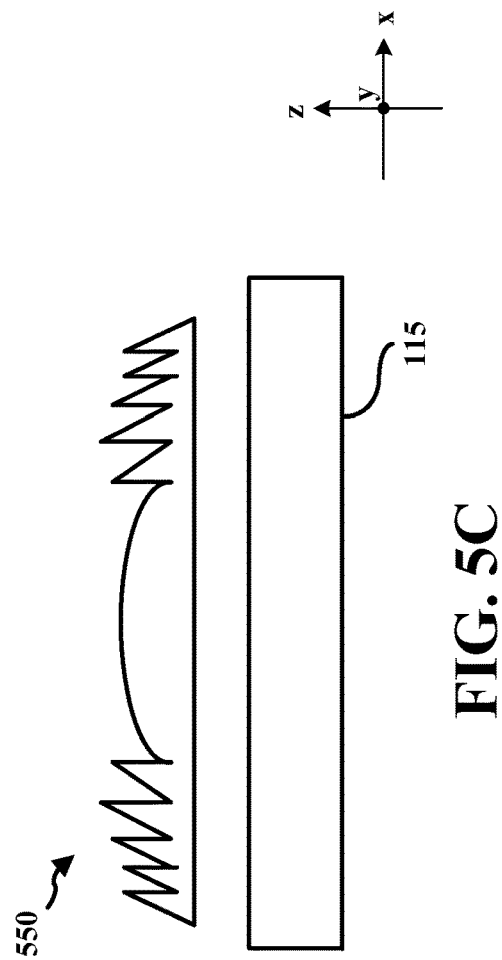
FIG. 5C illustrates a side view of an alternative optical system of FIG. 5A, in accordance with certain aspects of this disclosure.

FIG. 5C illustrates a side view of another example optical system 550 with a PDAF sensor 115. In the illustrated example of FIG. 5C, the optical system 550 is a subsection of a Fresnel lens and is positioned above the imaging sensor 115 and configured to direct light to the imaging sensor 115. The subsection of the Fresnel lens of the optical system 550 may be rectangular shaped so that the optical system 550 is longer in the x-direction than it is wide in the y-direction. However, it should be appreciated that in other example, the subsection of the Fresnel lens of the optical system 550 may be any shape or size that is a subsection of a full lens (e.g., a full Fresnel lens 270). Similar to the optical system 500 of FIGS. 5A and 5B, the example optical system 550 of FIG. 5C may be a slice of the imaging lens 270 (e.g., if, in some examples, imaging lens 270 is a Fresnel lens). Thus, the shape of the optical system 550 may maintain the shape of the corresponding portion or slice of the imaging lens 270. Accordingly, it should be appreciated that the example optical system 550 retains the light capturing properties associated with the corresponding portion or slice of a Fresnel lens.

Figure 6B:
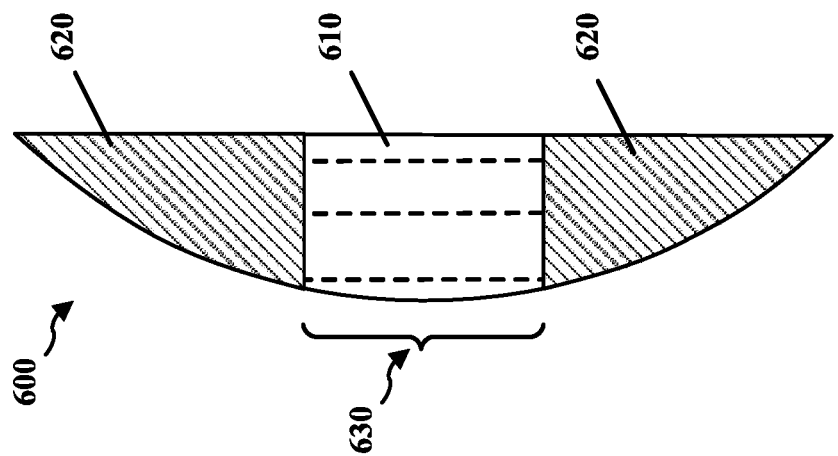
FIG. 6B illustrates a side view of the second example optical system of FIG. 6A, in accordance with certain aspects of this disclosure.
Figure 6A:
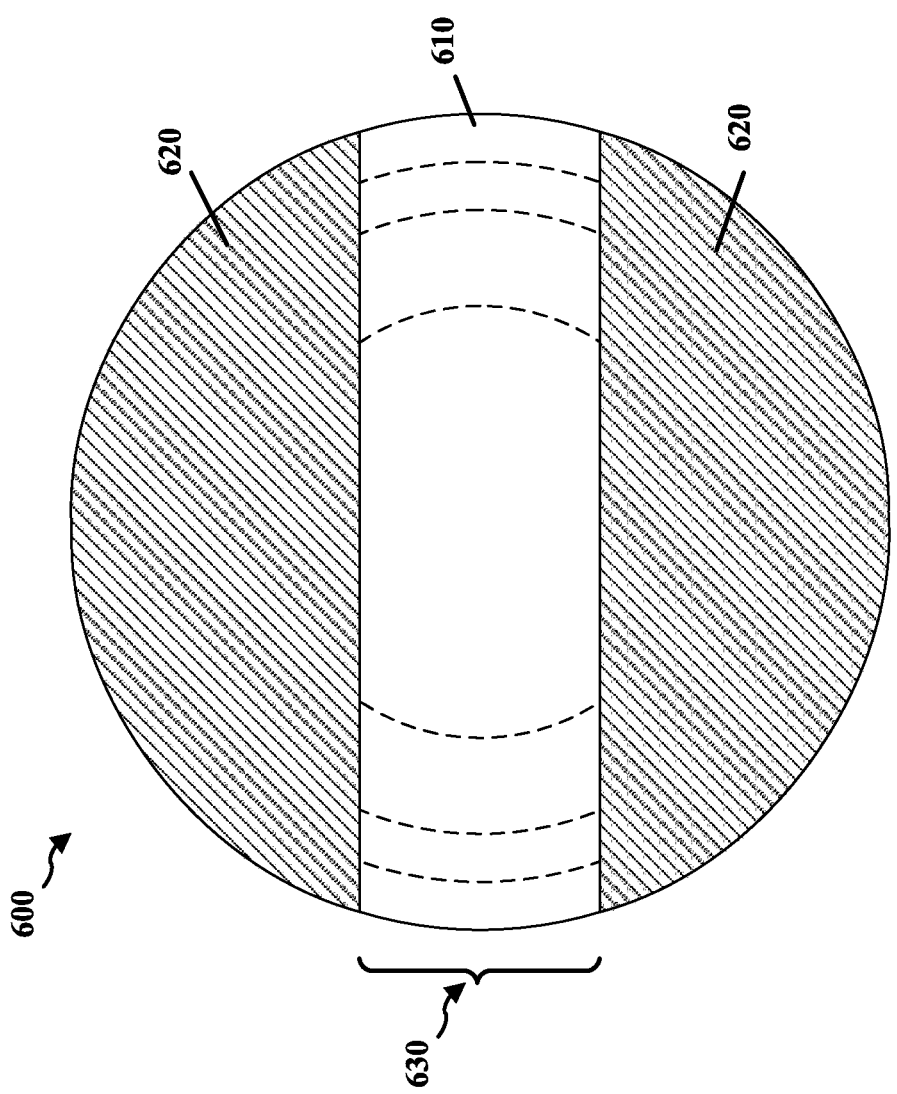
FIG. 6A illustrates a top view of a second example optical system, in accordance with certain aspects of this disclosure.

FIG. 6A illustrates a top view of a second example optical system 600. FIG. 6B illustrates a side view of the second example optical system 600. The optical system 600 includes a circular symmetric lens 610 and opaque lens films (or coatings) 620 to block light from entering the lens at the respective film locations. The opaque lens films 620 block light from entering the lens 610 except for a circular asymmetric subsection 630 of the lens 610 (i.e., the portion of FIGS. 6A and 6B shown without hatch marks). In this example, the circular asymmetric subsection 630 of the lens 610 corresponds to the optical system 500 (e.g., a subsection of an imaging lens). Both of the optical systems 500, 600 have the same performance (i.e., the same horizontal phase disparity). Whereas the optical system 500 may be formed with molds for creating just the subsection of the lens, the optical system 600 may be formed with a normal circular symmetric lens, but then adding opaque lens films or coatings 620 at the respective film locations to facilitate allowing particular subsections of the lens 610 to pass light (e.g., to a PDAF sensor).

Although the lens 610 of FIGS. 6A and 6B is a circular symmetric lens, it should be appreciated that in other examples, the lens may be a spherical lens, an aspherical lens, a cylindrical lens, or a Fresnel lens.

Figure 7:
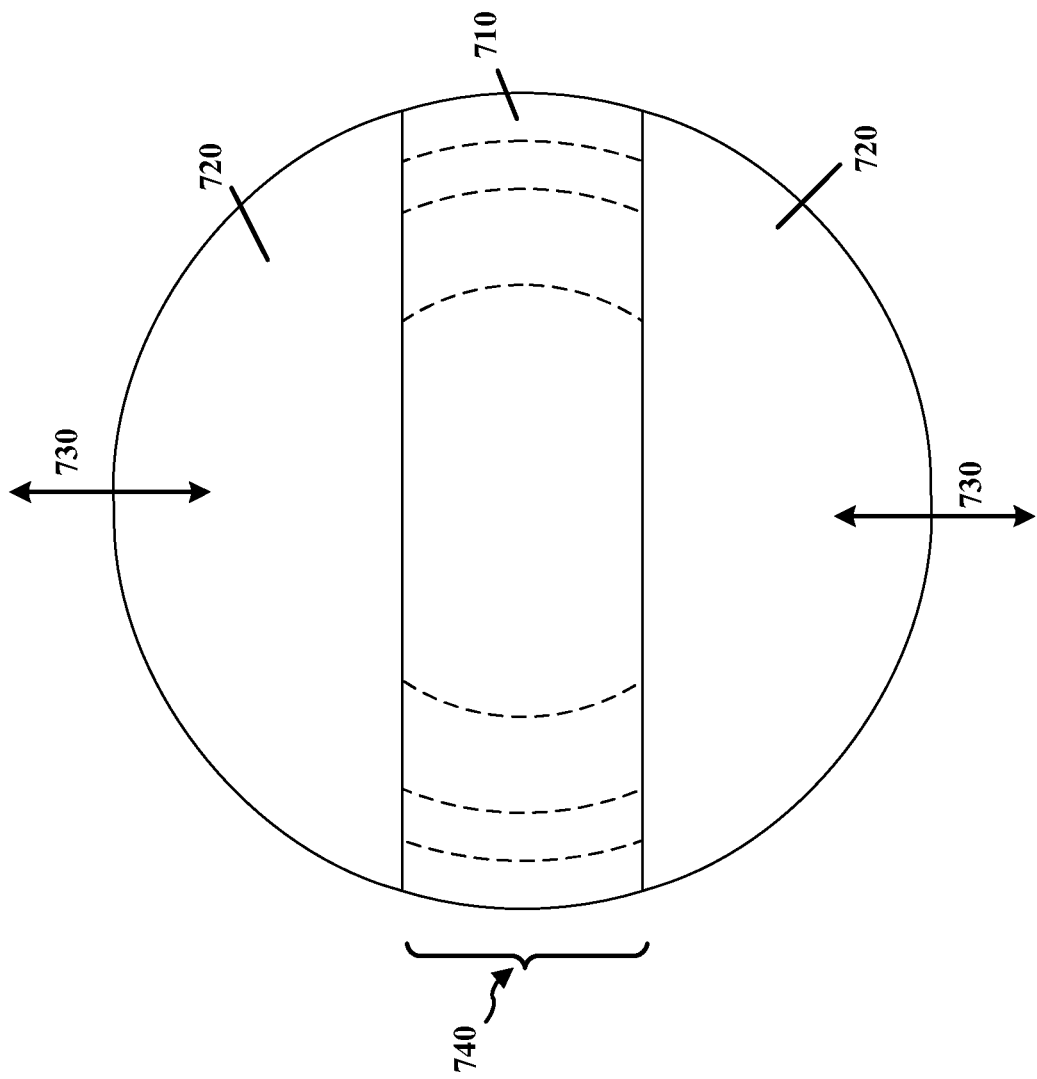
FIG. 7 illustrates a top view of a third example optical system, in accordance with certain aspects of this disclosure.

FIG. 7 illustrates a top view of a third example optical system 700. The optical system 700 includes a circular symmetric lens 710 and shutters (e.g., plastic, metal, or any other suitable material) 720 to facilitate blocking light from entering the lens 710 at respective shutter locations. When needed, the shutters 720 may move in the direction 730 in order to block light from entering the lens 710 except for a circular asymmetric subsection 740 of the lens 710. In this example, the circular asymmetric subsection 740 of the lens 710 corresponds to the optical system 500 (e.g., a subsection of an imaging lens). Each of the optical systems 500, 600, 700 provide the same performance (i.e., the same horizontal phase disparity).

In the illustrated example of FIG. 7, the optical system 700 may be formed with a normal circular symmetric lens with shutters positioned above (as illustrated) or below the lens or positioned to slide out (in directions 730) above (as illustrated) or below the lens for allowing a particular subsection of the lens 710 to pass light (e.g., to a PDAF sensor). Specifically, the shutters 720 can be positioned above the lens 710 to facilitate blocking light from reaching the lens 710 or the shutter 720 can be positioned below the lens 710 to facilitate blocking light that passes through the lens 710 at the locations of the shutters 720 from reaching a PDAF sensor.

Although the lens 710 of FIG. 7 is a circular symmetric lens, it should be appreciated that in other examples, the lens may be a spherical lens, an aspherical lens, a cylindrical lens, or a Fresnel lens.

FIG. 8A illustrates a top view of a fourth example optical system 800. FIG. 8B illustrates a side view of the fourth example optical system 800 with a PDAF sensor 115. As shown in FIG. 8B, the optical system 800 is positioned above the imaging sensor 115 and is configured to direct light to the imaging sensor 115. In FIGS. 8A and 8B, the optical system 800 includes two subsections 812, 814 of a lens, such as, for example, subsections of the imaging lens 270 of FIGS. 2D and 2E. For example, the optical system 800 may include different slices of the imaging lens 270. Thus, the shape of the optical system 800 may maintain the shape of the corresponding portions or slices of the imaging lens 270. For example, if the imaging lens is a plano-convex lens (as shown in FIGS. 2D and 2E), the optical system 800 may have the same curvature as the corresponding portions or slices of the plano-convex lens. Accordingly, the example optical system 800 retains the light capturing properties associated with the corresponding portions or slices of the imaging lens 270. With the optical system 800 of FIGS. 8A and 8B being two subsections of a full lens, center of mass points 810L, 810R increase in distance between each other as compared to the corresponding center of mass points of a full lens (e.g., as shown in FIG. 3). The increase in distance between the center of mass points 810L, 810R increases the aforementioned phase disparity, which improves the quality of PDAF depth sensing and, consequently, the autofocus of the PDAF system.

It should be appreciated that since the optical system 800 of FIGS. 8A and 8B includes subsections of an imaging lens, the optical system 800 may not retain the circular symmetry of the full imaging lens (i.e., the optical system 800 is circular asymmetric).

In the illustrated example of FIGS. 8A and 8B, the subsection of the lens of the optical system 800 includes the two subsections 812, 814 spaced apart from each other horizontally in the x-direction. In some examples, the space between the spaced apart subsections may be empty. In some examples, a material may be disposed between the spaced apart subsections (e.g., the spaced apart subsections may be mounted on an opaque material and/or an opaque housing to hold the subsections in place). However, it should be appreciated that in some examples, portions of the lens not corresponding to the subsections of the lens may be configured to be opaque (e.g., painted or colored black). The positioning of the two subsections 812, 814 improves a horizontal phase disparity of the PDAF signal. Alternatively, the subsections of the optical system 800 may be spaced apart from each other vertically in the y-direction (diagram in FIG. 8A rotated 90 degrees). Such a configuration would improve a vertical phase disparity of the PDAF signal.

FIGS. 8A and 8B illustrate two separate subsections 812, 814 of an imaging lens, where together (e.g., when the two separate subsections 812, 814 are not spaced apart from each other) the lens subsections are circular asymmetric and where each subsection is located in the same corresponding location as its corresponding subsection of a circular symmetric lens. The optical system 800 could alternatively be obtained through the use of an opaque film or a shutter to facilitate blocking portions of the light at locations other than the subsections 812, 814 from reaching the imaging sensor (e.g., as generally shown in FIGS. 6A, 6B, and 7).

It should be appreciated that the imaging lens of FIGS. 8A and 8B may be a spherical lens, an aspherical lens, a cylindrical lens, or a Fresnel lens.

FIG. 9A illustrates a top view of a fifth example optical system 900. FIG. 9B illustrates a side view of the fifth example optical system 900 with a PDAF sensor 115. The optical system 900 provides a smaller footprint than the optical system 800, however the smaller footprint results in the optical system 900 collecting less light than the optical system 800. As shown in FIG. 9B, the optical system 900 is positioned above the imaging sensor 115 and is configured to direct light to the imaging sensor 115. In FIGS. 9A and 9B, the optical system 900 includes two subsections 912, 914 of a lens, such as, for example, subsections of the imaging lens 270 of FIGS. 2D and 2E. For example, the optical system 900 may include different slices of the imaging lens 270. Thus, the shape of the optical system 900 may maintain the shape of the corresponding portions or slices of the imaging lens 270. For example, if the imaging lens is a plano-convex lens (as shown in FIGS. 2D and 2E), the optical system 900 may have the same curvature as the corresponding portions or slices of the plano-convex lens. Accordingly, the example optical system 900 retains the light capturing properties associated with the corresponding portions or slices of the imaging lens 270. With the optical system 900 of FIGS. 9A and 9B being two subsections of a full lens, center of mass points 910L, 910R increase in distance between each other as compared to the corresponding center of mass points of a full lens (e.g., as shown in FIG. 3). The increase in distance between the center of mass points 910L, 910R increases the aforementioned phase disparity, which improves the quality of PDAF depth sensing and, consequently, the autofocus of the PDAF system.

It should be appreciated that since the optical system 900 of FIGS. 9A and 9B includes subsections of an imaging lens, the optical system 900 will not retain the circular symmetry of the full imaging lens (i.e., the optical system 900 is circular asymmetric).

In the illustrated example of FIGS. 9A and 9B, the subsection of the lens of the optical system 900 includes the two subsections 912, 914 spaced apart from each other horizontally in the x-direction. The positioning of the two subsections 912, 914 improves a horizontal phase disparity of the PDAF signal. Alternatively, the subsections of the optical system 900 may be spaced apart from each other vertically in the y-direction (diagram in FIG. 9A rotated 90 degrees). Such a configuration would improve a vertical phase disparity of the PDAF signal.

FIGS. 9A and 9B illustrate two separate subsections 912, 914 of an imaging lens, where together (e.g., when the two separate subsections 912, 914 are not spaced apart from each other) the lens subsections are circular asymmetric and where each subsection is located in the same corresponding location as its corresponding subsection of a circular symmetric lens. The optical system 900 could alternatively be obtained through the use of an opaque film or a shutter to facilitate blocking portions of the light at locations other than the subsections 912, 914 from reaching the imaging sensor (e.g., as generally shown in FIGS. 6A, 6B, and 7).

It should be appreciated that the imaging lens of FIGS. 9A and 9B may be a spherical lens, an aspherical lens, a cylindrical lens, or a Fresnel lens.

Figure 10B:
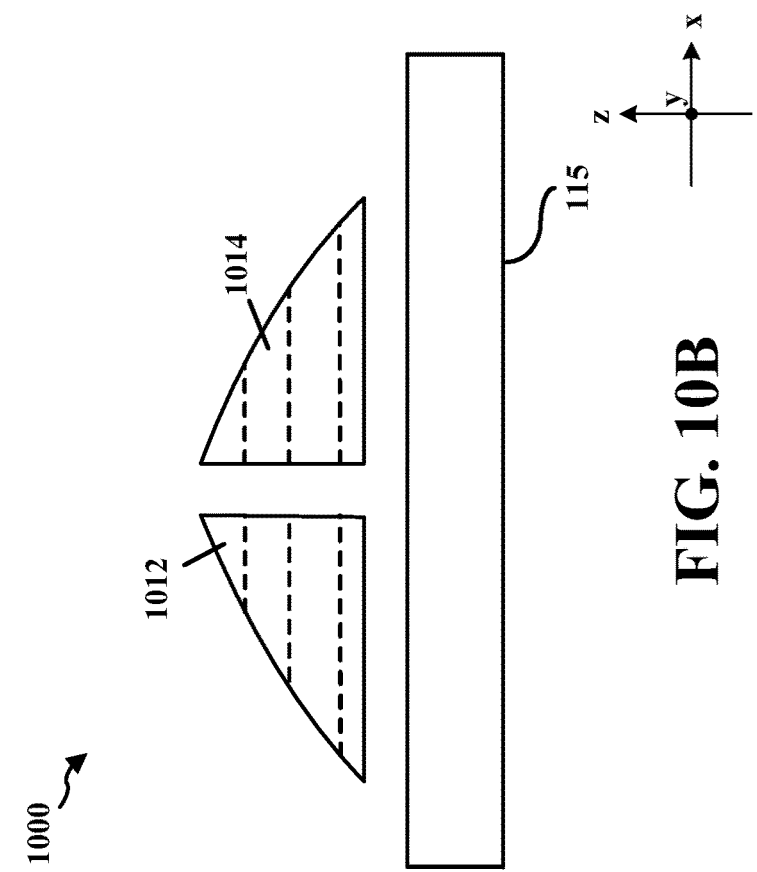
FIG. 10B illustrates a side view of the sixth example optical system of FIG. 10A, in accordance with certain aspects of this disclosure.
Figure 10A:
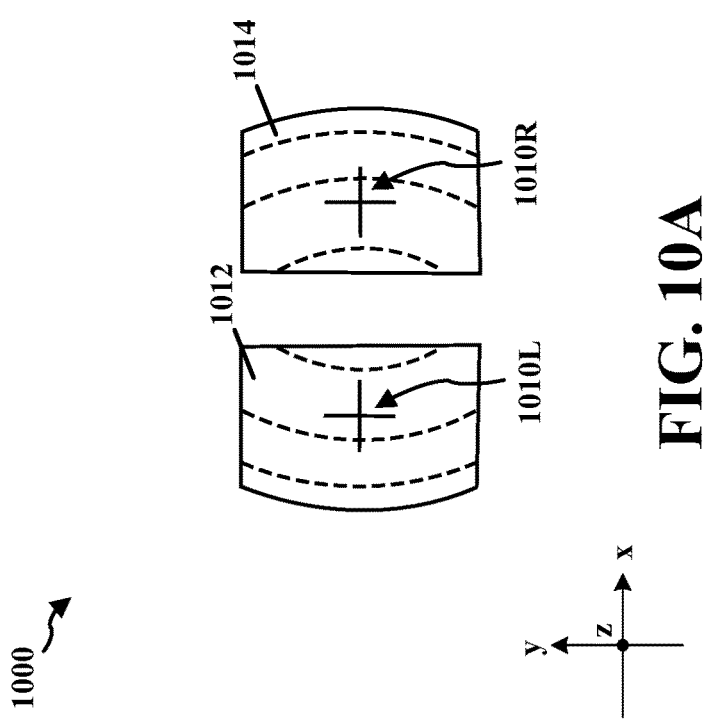
FIG. 10A illustrates a top view of a sixth example optical system, in accordance with certain aspects of this disclosure.

FIG. 10A illustrates a top view of a sixth example optical system 1000. FIG. 10B illustrates a side view of the sixth example optical system 1000 with a PDAF sensor 115. The optical system 1000 provides an even smaller footprint than the optical system 900, however the smaller footprint results in the optical system 1000 distorting the image as a result of the subsections not being located at a corresponding subsection portion of a circular symmetric lens (e.g., the imaging lens 270 of FIGS. 2D and 2E). As shown in FIG. 10B, the optical system 1000 is positioned above the imaging sensor 115 and is configured to direct light to the imaging sensor 115. In FIGS. 10A and 10B, the optical system 1000 includes two subsections 1012, 1014 of a lens, such as, for example, subsections of the imaging lens 270 of FIGS. 2D and 2E. For example, the optical system 1000 may include different slices of the imaging lens 270, where the different slices (subsections) are located closer to each other than where the corresponding subsections are located on the circular symmetric imaging lens 270. Thus, the shape of the optical system 1000 does not maintain the shape of corresponding portions of the imaging lens 270. For example, if the imaging lens is a plano-convex lens (as shown in FIGS. 2D and 2E), the optical system 1000 will not have the same curvature as the corresponding portions of the plano-convex lens. Accordingly, the example optical system 1000 may not retain the light capturing properties associated with the corresponding portions of the imaging lens 270. With the optical system 1000 of FIGS. 10 and 10B being two subsections of a full lens, center of mass points 1010L, 1010R increase in distance between each other as compared to the corresponding center of mass points of a full lens (e.g., as shown in FIG. 3). The increase in distance between the center of mass points 1010L, 1010R increases the aforementioned phase disparity, which improves the quality of PDAF depth sensing and, consequently, the autofocus of the PDAF system. However, while providing a smaller footprint than the optical system 900, the optical system 1000 has a smaller horizontal phase disparity of the PDAF signal than the optical system 900, and therefore the PDAF autofocus system may not perform as well as the optical system 900. Consequently, the smaller footprint and the shifting of the subsections from its corresponding location with respect to a circular symmetric lens in the optical system 1000 may result in relatively poorer PDAF depth sensing and a reduction in image quality as compared to the optical system 900 of FIGS. 9A and 9B.

It should be appreciated that since the optical system 1000 of FIGS. 10A and 10B includes subsections of an imaging lens, the optical system 1000 will not retain the circular symmetry of the full imaging lens (i.e., the optical system 1000 is circular asymmetric).

In the illustrated example of FIGS. 10A and 10B, the subsection of the lens of the optical system 1000 includes the two subsections 1012, 1014 spaced apart from each other horizontally in the x-direction. The positioning of the two subsections 1012, 1014 improves a horizontal phase disparity of the PDAF signal. Alternatively, the subsections of the optical system 1000 may be spaced apart from each other vertically in the y-direction (diagram in FIG. 10A rotated 90 degrees). Such a configuration would improve a vertical phase disparity of the PDAF signal.

It should be appreciated that the imaging lens of FIGS. 10A and 10B may be a spherical lens, an aspherical lens, a cylindrical lens, or a Fresnel lens.

Figure 11A:
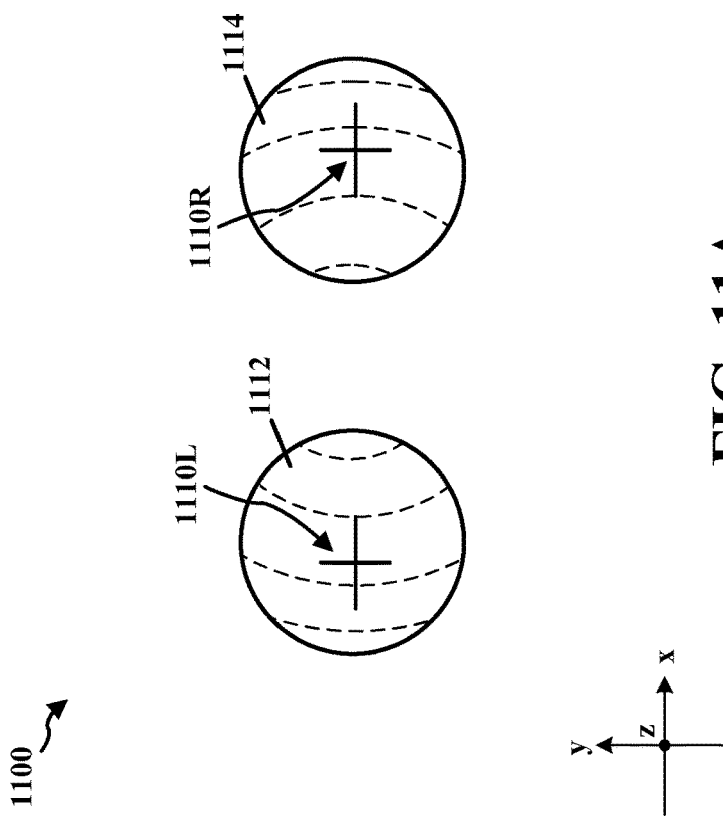
FIG. 11A illustrates a top view of a seventh example optical system, in accordance with certain aspects of this disclosure.
Figure 11B:
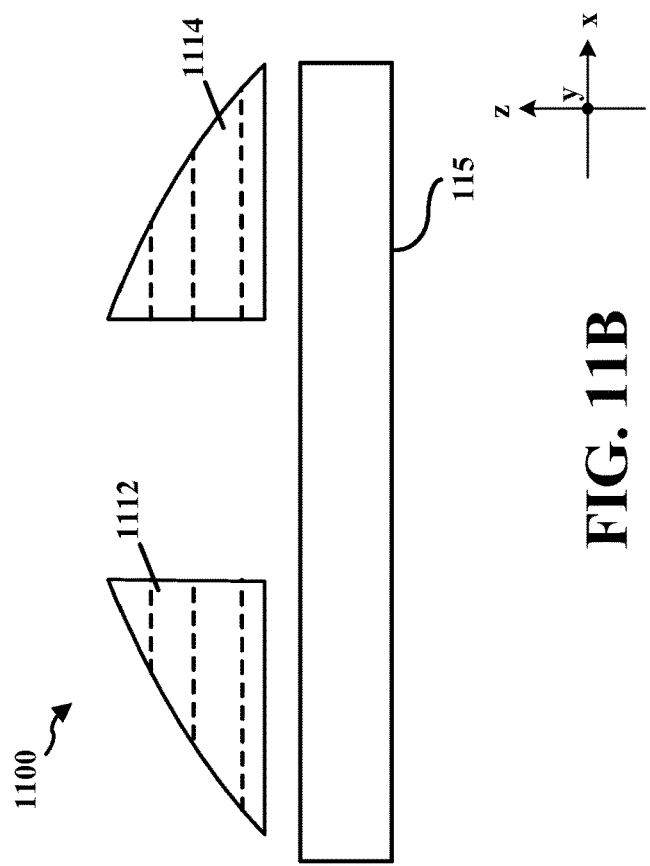
FIG. 11B illustrates a side view of the seventh example optical system of FIG. 11A, in accordance with certain aspects of this disclosure.

FIG. 11A illustrates a top view of a seventh example optical system 1100. FIG. 11B illustrates a side view of the seventh example optical system 1100 with a PDAF sensor 115. The optical system 1100 of FIGS. 11A and 11B provides a relatively smaller footprint and improves the horizontal phase disparity of the PDAF signal over the optical system 800 of FIGS. 8A and 8B, however, the smaller footprint may result in the optical system 1100 collecting less light than the optical system 800. As shown in FIG. 11B, the optical system 1100 is positioned above the imaging sensor 115 and is configured to direct light to the imaging sensor 115.

In FIGS. 11A and 11B, the optical system 1100 includes two subsections 1112, 1114 of a lens, such as, for example, subsections of the imaging lens 270 of FIGS. 2D and 2E. For example, the optical system 1100 may include different slices of the imaging lens 270. Thus, the shape of the optical system 1100 may maintain the shape of the corresponding portion of the imaging lens 270. For example, if the imaging lens is a plano-convex lens (as shown in FIGS. 2D and 2E), the optical system 1100 may have the same curvature as the corresponding portion of the plano-convex lens. Accordingly, the example optical system 1100 retains the light capturing properties associated with the corresponding portions of the imaging lens 270. With the optical system 1100 of FIGS. 11A and 11B being two subsections of a full lens, center of mass points 1110L, 1110R increase in distance between each other as compared to the corresponding center of mass points of a full lens (e.g., as shown in FIG. 3). The increase in distance between the center of mass points 1110L, 1110R increases the aforementioned phase disparity, which improves the quality of PDAF depth sensing and, consequently, the autofocus of the PDAF system.

It should be appreciated that since the optical system 1100 of FIGS. 11A and 11B includes subsections of an imaging lens, the optical system 1100 will not retain the circular symmetry of the full imaging lens (i.e., the optical system 1100 is circular asymmetric).

In the illustrated example of FIGS. 11A and 11B, the subsection of the lens of the optical system 1100 includes the two subsections 1112, 1114 spaced apart from each other horizontally in the x-direction. The positioning of the two subsections 1112, 1114 improves a horizontal phase disparity of the PDAF signal. Alternatively, the subsections of the optical system 1100 may be spaced apart from each other vertically in the y-direction (diagram in FIG. 11A rotated 90 degrees). Such a configuration would improve a vertical phase disparity of the PDAF signal.

FIGS. 11A and 11B illustrate two separate subsections 1112, 1114 of an imaging lens, where together (e.g., when the two separate subsections 1112, 1114 are not spaced apart from each other) the lens subsections are circular asymmetric and located in the same corresponding location as its corresponding subsection of a circular symmetric lens. The optical system 1100 could alternatively be obtained through the use of an opaque film or a shutter to facilitate blocking portions of the light at locations other than the subsections 1112, 1114 from reaching the imaging sensor (e.g., as generally shown in FIGS. 6A, 6B, and 7).

It should be appreciated that the imaging lens of FIGS. 11A and 11B may be a spherical lens, an aspherical lens, a cylindrical lens, or a Fresnel lens.

FIG. 12A illustrates a top view of an eighth example optical system 1200. FIG. 12B illustrates a top view of a ninth example optical system 1210. FIG. 12C illustrates a top view of a tenth example optical system 1220. FIG. 12D illustrates a top view of an eleventh example optical system 1230. As illustrated in FIGS. 12A, 12B, 12C, and 12D, each of the optical systems 1200, 1210, 1220, 1230 may include four separate subsections, providing both horizontal phase disparity improvements for a PDAF signal and vertical phase disparity improvements for the PDAF signal. The subsection shapes may be rectangular, square, circular, oval, triangular, or any other shape.

FIGS. 12A, 12B, 12C, and 12D illustrate four separate subsections of a lens, where together (e.g., when the four separate subsections of the respective optical systems are not spaced apart from each other) the lens subsections are circular asymmetric and are located in the same corresponding locations as their corresponding subsection of a circular symmetric lens (e.g., the imaging lens 270 of FIGS. 2D and 2E). The optical systems 1200, 1210, 1220, 1230 could alternatively be obtained through the use of an opaque film or a shutter to facilitate blocking portions of the light at locations other than the illustrated subsections from reaching the imaging sensor (e.g., as generally shown in FIGS. 6A, 6B, and 7).

It should be appreciated that the imaging lens of FIGS. 12A, 12B, 12C, and/or 12B may be a spherical lens, an aspherical lens, a cylindrical lens, or a Fresnel lens.

It should be appreciated that in some examples, the lens subsections of the respective optical systems 1200, 1210, 1220, 1230 may not be located at corresponding subsection portions of a respective imaging lens (e.g., as generally shown in FIGS. 10A and 10B).

Figure 13:
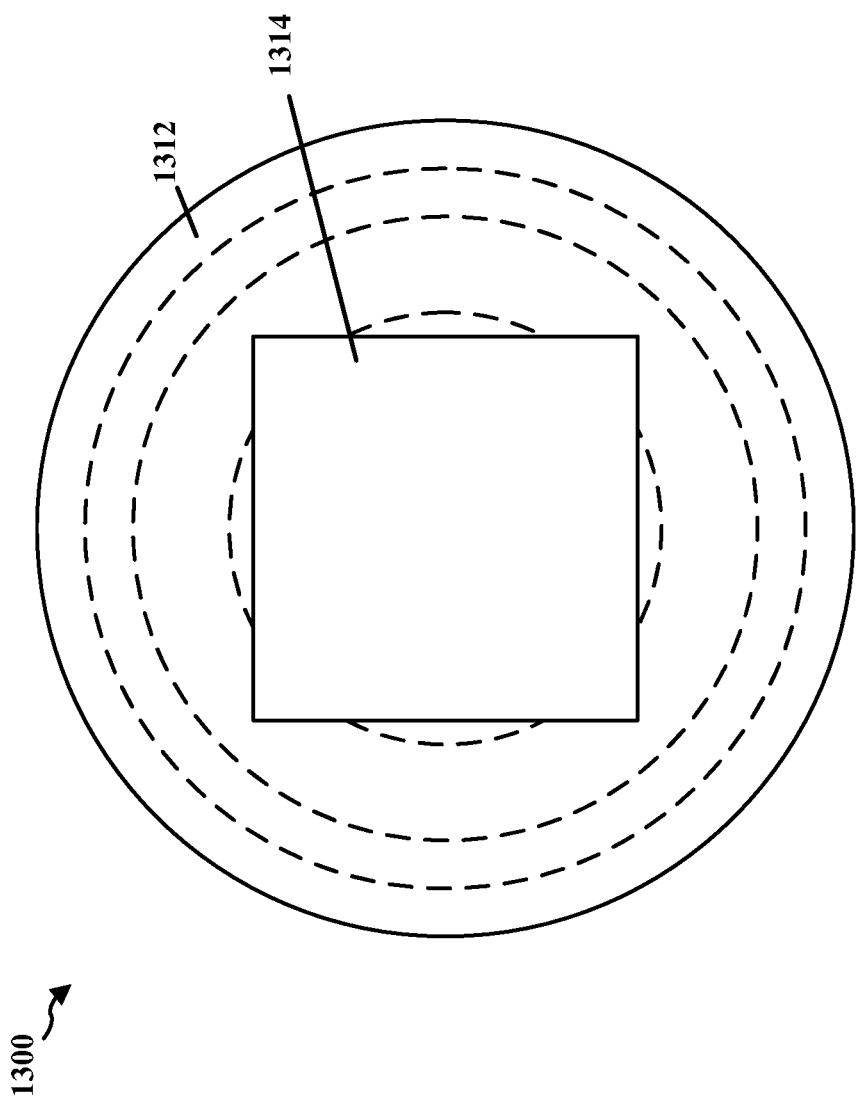
FIG. 13 illustrates a top view of a twelfth example optical system, in accordance with certain aspects of this disclosure.

FIG. 13 illustrates a top view of a twelfth example optical system 1300. In one configuration, the optical system 1300 includes a circular asymmetric lens 1312 with a cutout 1314 from the lens 1312. The cutout 1314 of FIG. 13 is illustrated as a square, but could be any shape, such as circular, rectangular, triangular, etc. If the cutout 1314 is circular symmetric (e.g., a circle) and centered on the lens 1312, then the lens 1312 would be circular symmetric. In another configuration, the lens 1312 may be a full circular symmetric lens with an opaque film covering a portion of the lens. It should be appreciated that the shape of the opaque film may be any shape, such as a square, circular, rectangular, triangular, etc.

It should be appreciated that the imaging lens of FIG. 13 may be a spherical lens, an aspherical lens, a cylindrical lens, or a Fresnel lens.

Figures 14A, 14B:
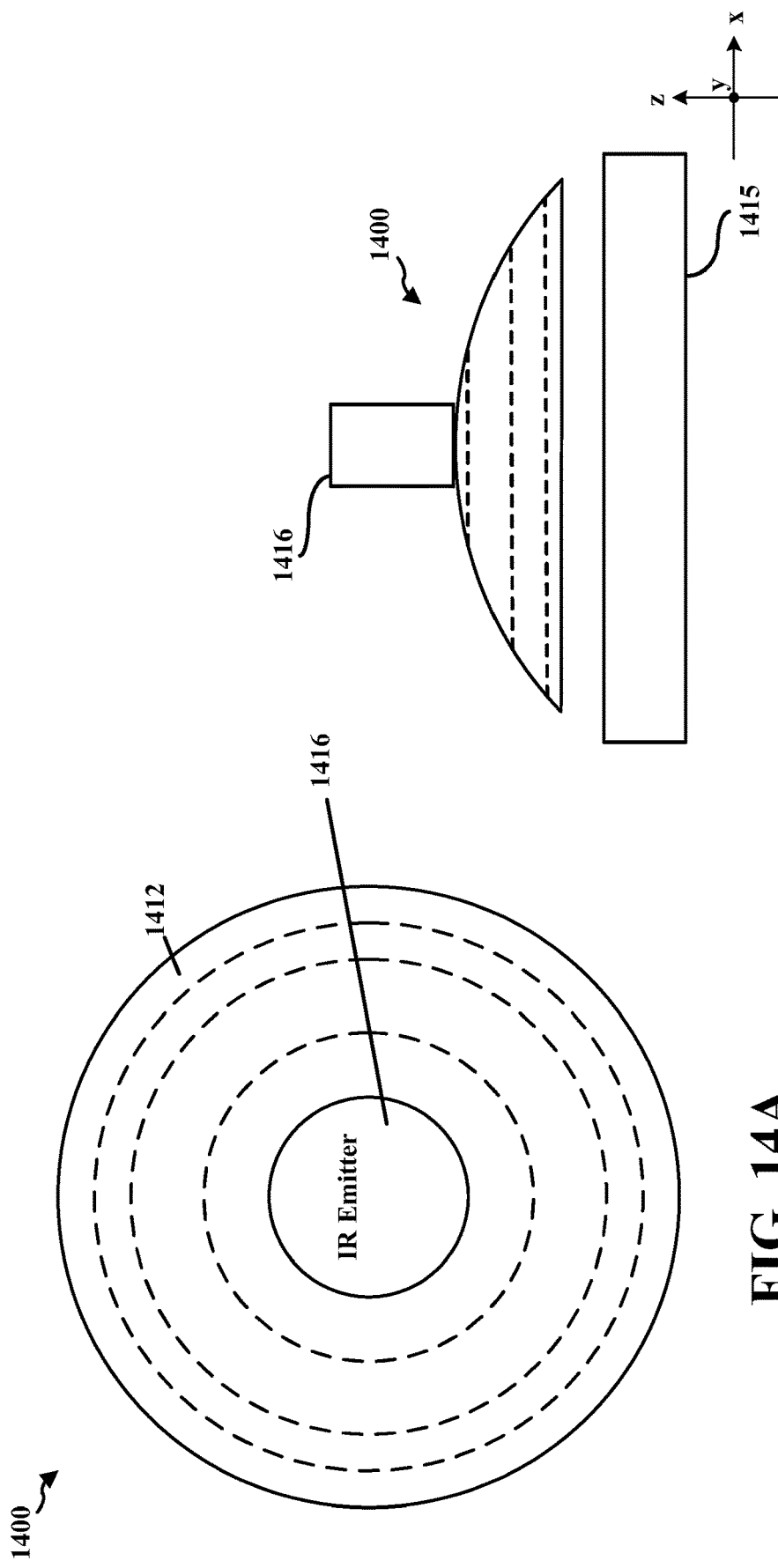
FIG. 14A illustrates a top view of a thirteenth example optical system, in accordance with certain aspects of this disclosure.
FIG. 14B illustrates a side view of the thirteenth example optical system of FIG. 14A, in accordance with certain aspects of this disclosure.

FIG. 14A illustrates a top view of a thirteenth example optical system 1400. FIG. 14B illustrates a side view of the thirteenth example optical system 1400 with an infrared (IR) emitter 1416. In the illustrated example of FIGS. 14A and 14B, the optical system 1400 includes a circular asymmetric lens 1412 and the infrared (IR) emitter 1416. As shown in FIG. 14B, the IR emitter 1416 may be positioned above the circular asymmetric lens 1412 so that the circular asymmetric lens 1412 is positioned between the IR emitter 1416 and an imaging sensor 1415. Aspects of the imaging sensor 1415 may be implemented by the imaging sensor 115 of FIG. 1. In such a configuration, the imaging sensor 1415 may include IR focus pixels designed to collect IR light. It should be appreciated that while the IR emitter 1416 is positioned so that IR light emitted by the IR emitter 1416 is emitted from in front of the circular asymmetric lens 1412 of the illustrated example, in other examples, the IR emitter 1416 may be positioned adjacent to the optical system 1400. For example, the IR emitter 1416 may be positioned next to the asymmetric lens 1412. In some examples, by positioning the IR emitter 1416 above the asymmetric lens 1412, the footprint of the optical system 1400 may be small. Such a small footprint may be beneficial for an image capture device. For example, a medical device that may be inserted inside a patient (e.g., inside a vein, inside a color, etc.) may benefit from having a small footprint to, for example, reduce discomfort to the patient.

In some examples, the IR emitter 1416 may be positioned between the imaging sensor 1415 and the asymmetric lens 1412. For example, the asymmetric lens 1412 may include a cutout portion and the IR emitter 1416 may be positioned such that IR light emitted by the IR emitter 1416 is emitted through the cutout. In some such examples, the cutout may be any suitable shape, such as a square, a circle, a rectangle, a triangle, etc. In some examples, the IR emitter 1416 may be integrated with the imaging sensor 1415 of the optical system 1400. For example, the imaging sensor 1415 of the optical system 1400 may include an array of pixels and the IR emitter 1416.

As shown in FIG. 14B, the IR emitter 1416 is positioned in front of the asymmetric lens 1412. In some examples, the IR emitter 1416 may be mounted above the asymmetric lens 1412. For example, the IR emitter 1416 may be attached to a lens housing holding the asymmetric lens 1412 in position. In some examples, the IR emitter 1416 may be attached to an opaque portion of the asymmetric lens 1412. In some examples, one or more rods may be configured to mount the IR emitter 1416 above the asymmetric lens 1412. In some such examples, the one or more rods may be configured and positioned, with respect to the asymmetric lens 1412 and the imaging sensor 1415, so as to reduce the amount of incoming that may be blocked by the one or more rods from reaching the imaging sensor 1415. It should be appreciated that while the example IR emitter 1416 of FIGS. 14A and 14B is depicted as having a cylindrical shape, in other examples, the IR emitter 1416 may have any suitable shape, such as a rectangular shape (e.g. a box shape). Furthermore, it should be appreciated that the IR emitter 1416 may include a laser diode and a diffractive optical element (DOE) that is mounted above the laser diode and is configured to generate a pattern using the IR light emitted by the laser diode.

It should be appreciated that the imaging lens of FIGS. 14A and 14B may be a spherical lens, an aspherical lens, a cylindrical lens, or a Fresnel lens.

Figure 15:
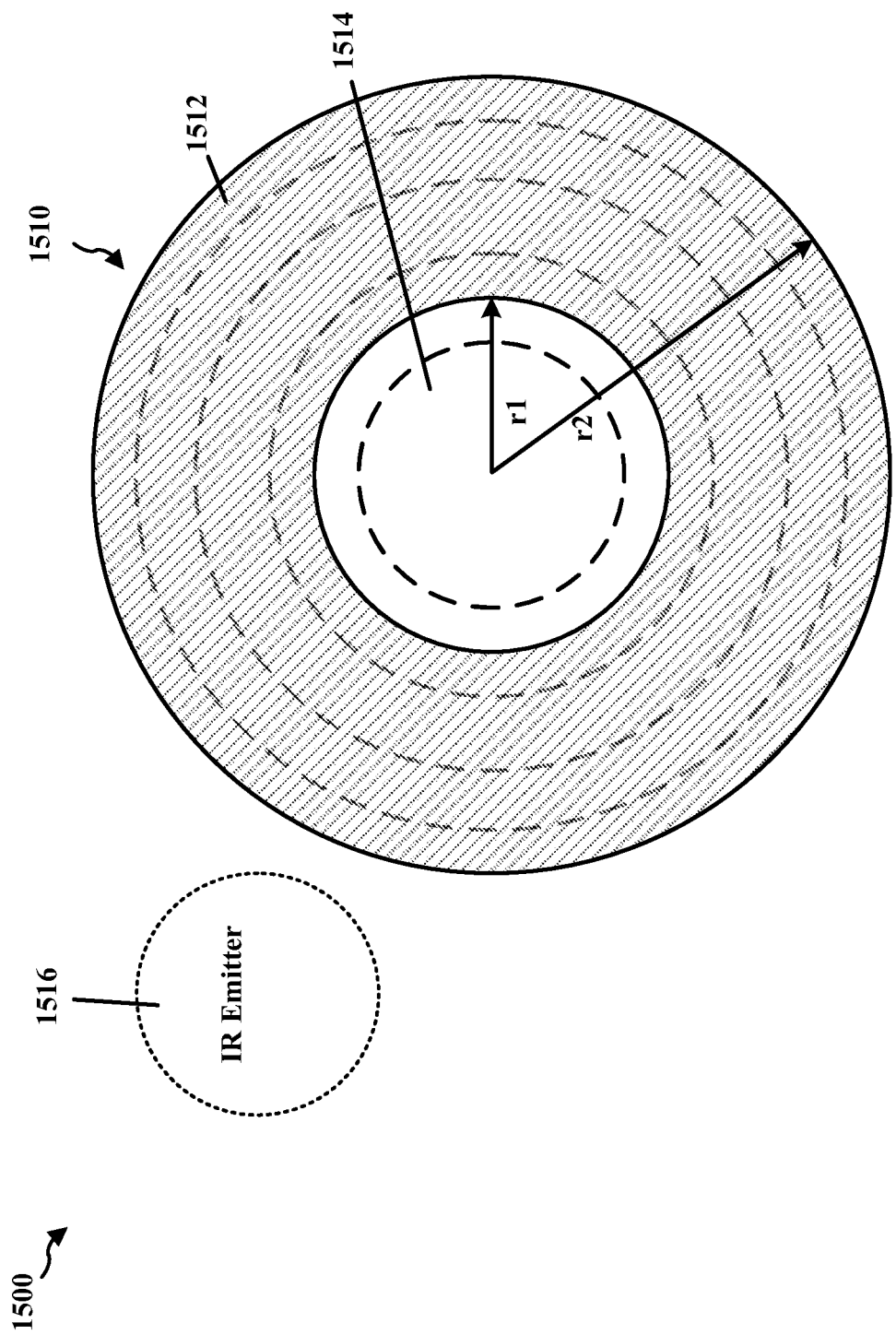
FIG. 15 illustrates a top view of a fourteenth example optical system, in accordance with certain aspects of this disclosure.

FIG. 15 illustrates a top view of a fourteenth example optical system 1500. In one configuration, the optical system 1500 includes a full circular symmetric lens 1510, where a first film 1512 is located at an outer portion of the lens 1510. In the illustrated example of FIG. 15, the outer portion extends between a first radius r1 and a second radius r2. The first film 1512 is transparent to IR and blocks visible light. An inner portion 1514 of the lens 1510 is transparent to visible light. The inner portion 1514 corresponds to the portion of the lens 1510 that is within the first radius r1. In one configuration, the lens 1510 includes a second film at the inner portion 1514 that blocks IR light. The optical system 1500 may further include an IR emitter 1516. The optical system 1500 provides two separate functions, where a first function is imaging and a second function is focusing. The imaging function is provided primarily by the portion transparent to visible light within the first radius r1 (e.g., the inner portion 1514). The focusing function is provided primarily by the portion transparent to IR light (e.g., the outer portion of the lens 1510 that is between the first radius r1 and the second radius r2). It should be appreciated that in some examples, the focusing function may also be provided by the inner portion 1514 that is transparent to visible light within the first radius r1. In such a configuration, an imaging sensor may include both IR focus pixels and imaging focus pixels. The shape of the lens portion transparent to IR light (between the first radius r1 and the second radius r2) provides improvements in both horizontal and vertical phase disparities of the PDAF signal, whereas the inner portion of the lens within the first radius r1 (e.g., the inner portion 1514)

provides the imaging. In this configuration, there is no distortion of the image as compared to previous configurations.

It should be appreciated that the imaging lens of FIG. 15 may be a spherical lens, an aspherical lens, a cylindrical lens, or a Fresnel lens.

It should be appreciated that in some examples, the example optical systems disclosed herein may be included with the example compound lens 400 of FIG. 4. For example, the example compound lens 400 may include the front lens 402, the secondary lens 404, the rear lens 408, and the optical systems 500, 550, 600, 700, 800, 900, 1000, 1100, 1200, 1210, 1220, 1230, 1300, 1400, and/or 1500. In some examples, the example optical systems disclosed herein may replace one or more of the front lens 402, the secondary lens 404, and/or the rear lens 408 of the compound lens. In some examples, the example optical systems disclosed herein may replace all of the lens 402, 404, 408 of the compound lens.

Furthermore, as described above, in some examples, the imaging sensor may include one or more configurations of OCLs. Thus, it should be appreciated that the example optical systems disclosed herein may be used in conjunction with the different configurations of imaging sensors disclosed herein. For example, the PDAF sensor may be an OCL that spans two or more pixels in a first direction and two or more pixels in a second direction (e.g., the PDAF sensor is a 2×2 OCL, a 3×3 OCL, a 4×4 OCL, etc.).

It should be appreciated that in some examples, the example optical systems disclosed herein may include an imaging lens that is a spherical lens, an aspherical lens, a cylindrical lens, or a Fresnel lens. For example, the subsection(s) of the optical systems 500, 550, 600, 700, 800, 900, 1000, 1100, 1200, 1210, 1220, 1230, 1300, 1400, and/or 1500 may be one or more subsections of a spherical lens, an aspherical lens, a cylindrical lens, or a Fresnel lens.

It should be appreciated that in some examples, the optical systems disclosed herein may be obtained via subsections (or slices) of an imaging lens or through the use of an opaque film or a shutter to facilitate blocking portions of the light at locations other than the subsections of the respective optical systems from reaching the imaging sensor (e.g., as generally shown in FIGS. 6A, 6B, and 7). For example, the optical systems 500, 550, 600, 700, 800, 900, 1000, 1100, 1200, 1210, 1220, 1230, 1300, 1400, and/or 1500 may be obtained by slicing the respective subsection(s) of an imaging lens or through the use of an opaque file or a shutter to facilitate blocking portions of the light at locations other than the subsection(s) of the respective optical systems from reaching the imaging sensor.

It should be appreciated that in some examples, the lens subsections of the respective optical systems 500, 550, 600, 700, 800, 900, 1000, 1100, 1200, 1210, 1220, 1230, 1300, 1400, and/or 1500 may not be located at corresponding subsection portions of a respective imaging lens (e.g., as generally shown in FIGS. 10A and 10B).

It should be appreciated that in some examples in which the lens subsections are spaced apart, such as in the optical systems 800, 900, 1000, 1100, 1200, 1210, 1220, and/or 1230, space between the spaced apart subsections may be empty. In some examples, a material may be disposed between the spaced apart subsections (e.g., the spaced apart subsections may be mounted on an opaque material and/or an opaque housing to hold the subsections in place). However, it should be appreciated that in some examples, portions of the lens not corresponding to the subsections of the lens may be configured to be opaque (e.g., painted or colored black).

It should be appreciated that example techniques disclosed herein facilitate providing improved PDAF depth sensing. Examples techniques provide such benefits by providing different configurations of optical systems used in image capture devices. Furthermore, it should be appreciated that example techniques disclosed herein facilitate reducing the cost (e.g., physical space) of the optical systems used in image capture devices as, in some examples, rather than a full imaging lens, the disclosed optical systems may include one or more subsections of the imaging lens.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

Various examples have been described. These and other examples are within the scope of the following claims.

What is claimed is:

1. An apparatus, comprising:
a phase detection auto focus (PDAF) sensor including a plurality of focus pixels and a plurality of micro lenses;
an optical system located above the PDAF sensor and configured to direct light to the plurality of micro lenses of the PDAF sensor, the optical system including a lens and an opaque element configured to block light through the lens except for at least one circular asymmetric subsection of the lens, wherein the at least one circular asymmetric subsection comprises a plurality of lens subsections, and the opaque element is configured to block light through the lens except for the plurality of lens subsections; and a housing disposed between the plurality of lens subsections, the housing configured to hold respective subsections of the plurality of lens subsections in place.

2. The apparatus of claim 1, wherein the lens is at least one of a spherical lens, an aspherical lens, a cylindrical lens, or a Fresnel lens.

3. The apparatus of claim 2, wherein the at least one circular asymmetric subsection of the lens is one of rectangular or circular.

4. The apparatus of claim 1, wherein the plurality of focus pixels comprise a subset of visible light PDAF pixels and a subset of infrared (IR) light PDAF pixels.

5. The apparatus of claim 1, further comprising an infrared (IR) light emitter.

6. The apparatus of claim 1, wherein the optical system further includes a filter configured to filter out visible light through the at least one circular asymmetric subsection of the lens.

7. The apparatus of claim 1, further comprising a compound lens including two or more lens elements, and wherein the optical system is configured to be at least one of the two or more lens elements.

8. An apparatus, comprising:
an infrared (IR) light emitter;
an optical system located above a phase detection auto focus (PDAF) sensor and configured to direct light to micro lenses of the PDAF sensor, the optical system including a lens and an opaque element configured to block light through the lens except for at least one circular asymmetric subsection of the lens, wherein the at least one circular asymmetric subsection comprises a plurality of lens subsections, and the opaque element is configured to block light through the lens except for the plurality of lens subsections, the PDAF sensor configured to include at least a set of focus pixels and a set of IR PDAF pixels, the set of IR PDAF pixels configured to receive IR light emitted by the IR light emitter; and
a housing disposed between the plurality of lens subsections, the housing configured to hold respective subsections of the plurality of lens subsections in place.

9. The apparatus of claim 8, wherein the lens is at least one of a spherical lens, an aspherical lens, a cylindrical lens, or a Fresnel lens.

10. The apparatus of claim 9, wherein each of the at least one circular asymmetric subsection of the lens is one of rectangular or circular.

11. The apparatus of claim 8, wherein the optical system further includes a filter configured to filter out visible light through the at least one circular asymmetric subsection of the lens.

12. The apparatus of claim 8, further comprising a compound lens including two or more lens elements, and wherein the optical system is configured to be at least one of the two or more lens elements.

13. An apparatus, comprising:
a phase detection auto focus (PDAF) sensor including a plurality of focus pixels and a plurality of micro lenses;
an optical system located above the PDAF sensor and configured to direct light to the plurality of micro lenses of the PDAF sensor, the optical system including a lens and an opaque element configured to block light through the lens except for at least one circular asymmetric subsection of the lens, wherein the at least one circular asymmetric subsection comprises a plurality of lens subsections, and the opaque element is configured to block light through the lens except for the plurality of lens subsections;
an aperture configured to adjust an amount of light received at the optical system; and
a housing disposed between the plurality of lens subsections, the housing configured to hold respective subsections of the plurality of lens subsections in place.

14. The apparatus of claim 13, wherein the lens is at least one of a spherical lens, an aspherical lens, a cylindrical lens, or a Fresnel lens.

15. The apparatus of claim 14, wherein the at least one circular asymmetric subsection of the lens is one of rectangular or circular.

16. The apparatus of claim 13, wherein the plurality of focus pixels of the PDAF sensor is configured to include a subset of visible light PDAF pixels and a subset of infrared (IR) light PDAF pixels.

17. The apparatus of claim 13, further comprising an infrared (IR) light emitter.

18. The apparatus of claim 13, wherein the optical system further includes a filter configured to filter out visible light through the at least one circular asymmetric subsection of the lens.

19. The apparatus of claim 13, further comprising a compound lens including two or more lens elements, and wherein the optical system is configured to be at least one of the two or more lens elements.

20. The apparatus of claim 1, wherein each of the plurality of lens subsections is a respective slice of a full lens.

21. The apparatus of claim 20, wherein each of the plurality of lens subsections is spaced apart from other subsections of the plurality of lens subsections in at least one of a horizontal direction or a vertical direction.

22. The apparatus of claim 20, wherein each of the plurality of lens subsections is configured to be located at a same location to a corresponding subsection of the full lens.

* * * * *